(12) United States Patent
Shao et al.

(10) Patent No.: US 12,087,204 B2
(45) Date of Patent: Sep. 10, 2024

(54) DISPLAY PANEL AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Xibin Shao, Beijing (CN); Yanping Liao, Beijing (CN); Dongchuan Chen, Beijing (CN); Yingmeng Miao, Beijing (CN); Shulin Yao, Beijing (CN); Yinlong Zhang, Beijing (CN); Qiujie Su, Beijing (CN); Jiantao Liu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/912,952

(22) PCT Filed: Oct. 28, 2021

(86) PCT No.: PCT/CN2021/126858
§ 371 (c)(1),
(2) Date: Sep. 20, 2022

(87) PCT Pub. No.: WO2022/247135
PCT Pub. Date: Dec. 1, 2022

(65) Prior Publication Data
US 2024/0212563 A1    Jun. 27, 2024

(30) Foreign Application Priority Data

May 28, 2021   (CN) .......................... 202110594338.4

(51) Int. Cl.
*G09G 3/20*          (2006.01)

(52) U.S. Cl.
CPC ...... *G09G 3/2092* (2013.01); *G09G 2310/0267* (2013.01); *G09G 2310/0286* (2013.01); *G09G 2310/08* (2013.01); *G09G 2320/041* (2013.01)

(58) Field of Classification Search
CPC ...... G09G 2310/0267; G09G 2310/0286; G09G 2310/08; G09G 2320/041
See application file for complete search history.

(56) References Cited

U.S. PATENT DOCUMENTS

| 5,532,553 A | 7/1996 | Flory, IV |
| 2011/0150169 A1 | 6/2011 | Lin et al. |

(Continued)

FOREIGN PATENT DOCUMENTS

| CN | 101916540 A | 12/2010 |
| CN | 102474243 A | 5/2012 |

(Continued)

OTHER PUBLICATIONS

Extended European Search Report dated Apr. 10, 2024 received in European Patent Application No. EP 21942699.6.

*Primary Examiner* — Peter D McLoone
(74) *Attorney, Agent, or Firm* — Scully, Scott, Murphy & Presser, P.C.

(57) ABSTRACT

A display panel and a display device are disclosed. The display panel includes a gate driving circuit, a plurality of clock signal lines, a timing controller and a plurality of anti-cross-row circuits; the timing controller is configured to provide a first clock signal; the plurality of anti-cross-row circuits are connected with the timing controller and the plurality of clock signal lines, and are configured to adjust the first clock signal provided by the timing controller to a second clock signal, and output the second clock signal to the plurality of clock signal lines, and a falling duration of a falling edge of the second clock signal is less than a falling duration of a falling edge of the first clock signal; and each (Continued)

of the plurality of anti-cross-row circuits comprises at least one resistor and at least one inductor.

20 Claims, 11 Drawing Sheets

(56) References Cited

U.S. PATENT DOCUMENTS

| | | | |
|---|---|---|---|
| 2012/0169391 | A1 | 7/2012 | Sofer et al. |
| 2016/0275849 | A1 | 9/2016 | Tsai |
| 2017/0309240 | A1 | 10/2017 | Zhang et al. |
| 2020/0211466 | A1* | 7/2020 | In .................. G09G 3/2096 |

FOREIGN PATENT DOCUMENTS

| | | | |
|---|---|---|---|
| CN | 103475341 | A | 12/2013 |
| CN | 103514843 | A | 1/2014 |
| CN | 104867472 | A | 8/2015 |
| CN | 106033658 | A | 10/2016 |
| CN | 108847195 | A | 11/2018 |
| CN | 109243356 | A | 1/2019 |
| CN | 109448624 | A | 3/2019 |
| CN | 109979408 | A | 7/2019 |
| CN | 111599323 | A | 8/2020 |
| CN | 111754923 | A | 10/2020 |
| CN | 112216249 | A | 1/2021 |
| CN | 112419994 | A | 2/2021 |
| CN | 112687229 | A | 4/2021 |
| CN | 215834233 | U | 2/2022 |
| EP | 3296997 | A1 | 3/2018 |

* cited by examiner

DISPLAY PANEL AND DISPLAY DEVICE

This application is a U.S. National Phase Entry of PCT International Application No. PCT/CN2021/126858, filed on Oct. 28, 2021, which claims priority to Chinese Patent Application No. 202110594338.4, filed on May 28, 2021. The entire disclosure of PCT International Application No. PCT/CN2021/126858 and the entire disclosure of Chinese Patent Application No. 202110594338.4 are incorporated herein by reference as part of the subject application.

TECHNICAL FIELD

The embodiments of the present disclosure relate to a display panel and a display device.

BACKGROUND

In the field of display technology, for example, a pixel array of a liquid crystal display panel or an organic light-emitting diode (OLED) display panel generally includes a plurality of rows of gate scanning signal lines and a plurality of columns of data lines interlaced with the gate scanning signal lines. The driving of the gate scanning signal lines can be realized by a bonded integrated driving circuit. In recent years, with the continuous improvement of the manufacturing process of amorphous silicon thin film transistors or oxide thin film transistors, driving circuit of the gate scanning signal lines can also be directly integrated on the thin film transistor array substrate to form GOA (Gate driver On Array) to drive the gate scanning signal lines. For example, a GOA including a plurality of shift register units that are cascaded may be used to provide switching state voltage signals (scanning signals) for the plurality of rows of gate scanning signal lines of the pixel array, so as to, for example, control the plurality of rows of gate scanning signal lines to be sequentially turned on, and at the same time, the data lines provide data signals to pixel units of the corresponding row in the pixel array, so as to form grayscale voltages required for each grayscale of the display image in each pixel unit, and then display one frame of image.

SUMMARY

At least one embodiment of the present disclosure provides a display panel, comprising a gate driving circuit, a plurality of clock signal lines, a timing controller and a plurality of anti-cross-row circuits; the timing controller is configured to provide a first clock signal; the plurality of anti-cross-row circuits are connected with the timing controller and the plurality of clock signal lines, and are configured to adjust the first clock signal provided by the timing controller to a second clock signal, and output the second clock signal to the plurality of clock signal lines, and a falling duration of a falling edge of the second clock signal is less than a falling duration of a falling edge of the first clock signal; the gate driving circuit comprises a plurality of shift register units that are cascaded and is connected with the plurality of clock signal lines, respectively, and the gate driving circuit is configured to output the second clock signal as an output signal line by line, thereby shortening a falling duration of a falling edge of the output signal; and each of the plurality of anti-cross-row circuits comprises at least one resistor and at least one inductor.

For example, in the display panel provided by at least one embodiment of the present disclosure, the at least one resistor and the at least one inductor are connected in series or in parallel.

For example, in the display panel provided by at least one embodiment of the present disclosure, a first end of the at least one resistor is connected with the timing controller, and a second end of the at least one resistor is connected with the at least one inductor.

For example, in the display panel provided by at least one embodiment of the present disclosure, a total resistance value of an equivalent resistance of the anti-cross-row circuit is in a range from 1 ohm to 1000 ohm; and a total inductance value of an equivalent inductance of the anti-cross-row circuit is in a range from 1 microhenry to 1000 microhenry.

For example, in the display panel provided by at least one embodiment of the present disclosure, the at least one resistor comprises a first resistor and a second resistor, and the at least one inductor comprises a first inductor and a second inductor; the first resistor and the first inductor are connected in parallel to form a first element, and the second resistor and the second inductor are connected in parallel to form a second element; and the first element and the second element are connected in series.

For example, in the display panel provided by at least one embodiment of the present disclosure, a total resistance value of an equivalent resistance of the first element and an equivalent resistance of the second element is in a range from 1 ohm to 1000 ohm; or a total inductance value of an equivalent inductance of the first element and an equivalent inductance of the second element is in a range from 1 microhenry to 1000 microhenry.

For example, in the display panel provided by at least one embodiment of the present disclosure, the first clock signal comprises a first level and a second level sequentially arranged in a time domain, and the second clock signal comprises a third level and a fourth level sequentially arranged in the time domain; the first level is higher than the second level, and the third level is higher than the fourth level; the fourth level comprises a first sub-level and a second sub-level; and in the time domain, the second sub-level is between the third level and the first sub-level, and the second sub-level is lower than the first sub-level.

For example, in the display panel provided by at least one embodiment of the present disclosure, the first level is equal to the third level, and the first sub-level is equal to the second level.

For example, in the display panel provided by at least one embodiment of the present disclosure, the third level comprises a third sub-level and a fourth sub-level; in the time domain, the fourth sub-level is between the third sub-level and the second sub-level; and the third sub-level is higher than the fourth sub-level.

For example, in the display panel provided by at least one embodiment of the present disclosure, the fourth sub-level is equal to the first level.

For example, in the display panel provided by at least one embodiment of the present disclosure, the first clock signal comprises a first level and a second level sequentially arranged in a time domain, the second clock signal comprises a third level and a fourth level sequentially arranged in the time domain, the first level is higher than the second level, and the third level is higher than the fourth level; and the second level is higher than the fourth level.

For example, in the display panel provided by at least one embodiment of the present disclosure, the third level is higher than the first level.

For example, the display panel provided by at least one embodiment of the present disclosure further comprises a level conversion circuit, configured to convert the first clock signal into the second clock signal.

For example, in the display panel provided by at least one embodiment of the present disclosure, the shift register unit comprises an input circuit, an output circuit and a first node control circuit; the input circuit is connected with a first node, and is configured to charge the first node in response to an input signal; the output circuit is connected with the first node, and is configured to output an output signal to an output terminal under control of a level signal of the first node; and the first node control circuit is connected with a second node and a third node, respectively, and is configured to control a level of the second node and a level of the third node in response to the input signal.

For example, in the display panel provided by at least one embodiment of the present disclosure, the shift register unit further comprises a total reset circuit; and the total reset circuit is connected with the first node and a total reset terminal, and is configured to receive a total reset signal from the total reset terminal and control the level of the first node in response to the total reset signal.

For example, in the display panel provided by at least one embodiment of the present disclosure, the shift register unit further comprises a first node reset circuit, and the first node reset circuit is connected with the first node and configured to reset the first node in response to a reset signal.

For example, in the display panel provided by at least one embodiment of the present disclosure, the shift register unit further comprises a second node control circuit, a first node noise reduction circuit and an output noise reduction circuit; the second node control circuit is connected with the first node, the second node and the third node, respectively, and is configured to control the level of the second node and the level of the third node under control of the level signal of the first node; the first node noise reduction circuit is connected with the first node, the second node and the third node, and is configured to reduce noise of the first node under control of level signals of the second node and the third node; and the output noise reduction circuit is connected with the second node, the third node and the output terminal, and is configured to reduce noise of the output terminal under the control of the level signals of the second node and the third node.

For example, in the display panel provided by at least one embodiment of the present disclosure, the output terminal comprises a shift output terminal and at least one scanning signal output terminal.

For example, in the display panel provided by at least one embodiment of the present disclosure, the at least one scanning signal output terminal comprises one scanning signal output terminal, and the output circuit comprises a second transistor, a third transistor and a storage capacitor; a gate electrode of the second transistor is connected with the first node, a first electrode of the second transistor is connected with a clock signal terminal to receive the second clock signal, and a second electrode of the second transistor is connected with the shift output terminal; a gate electrode of the third transistor is connected with the first node, a first electrode of the third transistor is connected with the clock signal terminal to receive the second clock signal, and a second electrode of the third transistor is connected with the scanning signal output terminal; a first electrode of the storage capacitor is connected with the first node, and a second electrode of the storage capacitor is connected with the scanning signal output terminal; and the second clock signal is transmitted to the output terminal as the output signal.

For example, the display panel provided by at least one embodiment of the present disclosure further comprises a display region, a peripheral region surrounding the display region, and a circuit board, and the display region comprises a plurality of pixels arranged in array and is configured to receive output signals from the gate driving circuit for displaying; the gate driving circuit and the plurality of clock signal lines are in the peripheral region, the peripheral region comprises a corner part, and the corner part comprises some shift register units of the gate driving circuit and the plurality of clock signal lines; and the timing controller and the plurality of anti-cross-row circuits are on the circuit board.

At least one embodiment of the present disclosure further provides a display device, comprising the display panel according to any embodiment of the present disclosure.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
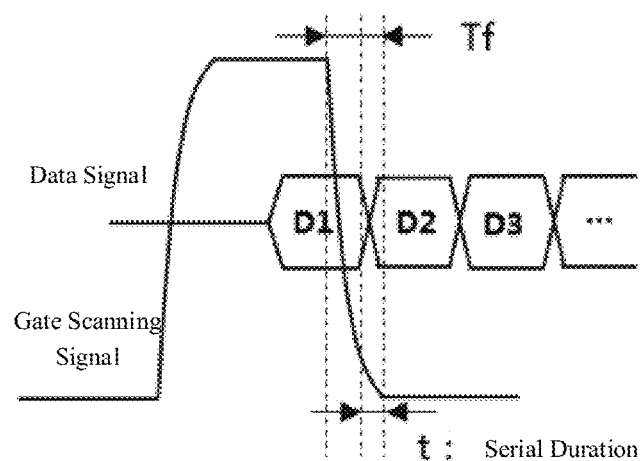
FIG. 1A is a schematic diagram of a pixel charging timing.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," "the," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below through several specific embodiments. To keep the following descriptions of the embodiments of the present disclosure clear and concise, detailed descriptions of well-known functions and well-known components may be omitted. When any component of an embodiment of the present disclosure appears in more than one drawing, the component is denoted by the same reference numeral in each drawing.

At present, in order to meet the market demand and improve the user experience, display products are developing in the direction of high resolution and high refresh rate. For example, the resolution and refresh rate of the display screen can reach 8K & 120 Hz, 4K & 240 Hz, etc. In addition, the panel manufacturers have developed more and more products such as 8K & 60 Hz display screens with dual gate and borderless display screens to reduce costs. These products have a common feature: 1H duration (the 1H duration means, for example, the duration that one row of pixels in the liquid crystal display panel is turned on or charged) is short. Table 1 shows the 1H duration corresponding to different display products. The shorter the 1H duration, the more difficult it is to charge the pixels in this row.

TABLE 1

| Product category | 4K 60 Hz | 4K 120 Hz | 8K 60 Hz | 8K 120 Hz | 4K 240 Hz | 8K Dual Gate |
|---|---|---|---|---|---|---|
| 1 H duration (µs) | 7.4 | 3.7 | 3.7 | 1.85 | 1.85 | 1.85 |

For example, when charging pixels, in order to ensure that the data can be displayed correctly, it is necessary to turn off the transmission of an active level (e.g., a high level) of the gate scanning signal on a gate line in time after the charging of the pixels is completed, and then the charging the pixels of the next row is performed; otherwise, a cross-row phenomenon will occur: that is, the data of the previous row will be displayed to the next row, or the data of the next row will be displayed to the previous row (the phenomenon that the data of one row is wrongly input into another row is called the cross-row phenomenon, which will not be described in detail below).

FIG. 1A is a schematic diagram of a pixel charging timing. For example, as shown in FIG. 1A, when the gate scanning signal is at a high level, the data signal D1 corresponding to the pixels of the first row is written into the pixels in the first row (i.e., charging the pixels in the first row) and the charging is ended only when the gate scanning signal is changed to be at a low level. However, because the falling duration Tf of the falling edge of the gate scanning signal is relatively large, the gate scanning signal has not completely changed to be at the low level, and the data signal D2 corresponding to the pixels in the second row has been output, so a cross-row duration t is generated. In the cross-row duration t, part of the data signal D2 corresponding to the pixels in the second row will be written into the pixels in the first row, so that the data written into the pixels in the first row will be distorted, that is, the data written into the pixels in the first row not only includes the data signal D1 to be displayed, but also includes the data signal D2 corresponding to the pixels in the second row. The longer the cross-row duration t, the more serious the distortion.

Figures 1B, 1C:
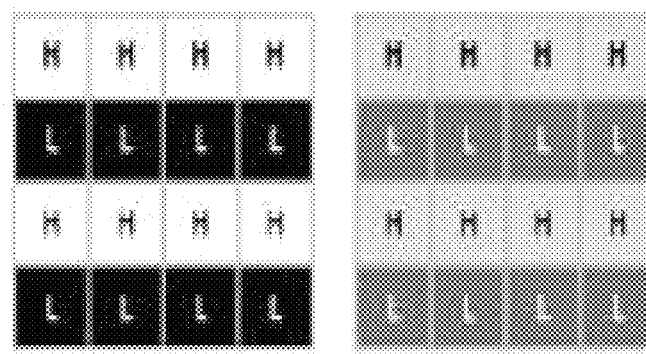
FIG. 1B is a schematic diagram of a display pattern of H-1Line in an ideal state.
FIG. 1C is a schematic diagram of a display pattern, in which a cross-row phenomenon occurs, of H-1Line in an actual state.

In addition, there is a serious cross-row problem in the actual sample verification of display products with a resolution of 8K and a refresh rate of 120 Hz. In particular, in the case where a H-1Line pattern is displayed on the display panel, due to the existence of the cross-row problem, the pattern displayed on the display product is a pattern, for example, as shown in FIG. 1C, in which the black lines are not black enough and the white lines are not white enough, instead of a display pattern of the H-1Line in the ideal state shown in FIG. 1B (for example, a pattern in which the black lines only display black and the white lines only display white as shown in FIG. 1B). Therefore, the cross-row problem occurs in the H-1Line pattern, that is, the display pattern is completely distorted. When the cross-row problem is serious, the H-1Line pattern is all rows of pixels being bright.

Therefore, in order to solve the cross-row problem of heavy-load H-1Line pattern of display products with the resolution and refresh rate of 8K & 120 Hz, it is necessary to reduce the loads of gate lines (resistance and capacitance). However, the gate lines of display products with a resolution of 8K are all copper lines, and the manufacturing process has reached the maximum copper thickness that can be achieved by the manufacturing process. Therefore, the optimization range is limited by reducing the loads of the gate lines by the manufacturing process, and other solutions must be found.

At least one embodiment of the present disclosure provides a display panel, including a gate driving circuit, a plurality of clock signal lines, a timing controller and a plurality of anti-cross-row circuits (a circuit that can prevent the cross-row phenomenon is called an anti-cross-row circuit, which will not be described in detail below); the timing controller is configured to provide a first clock signal; the plurality of anti-cross-row circuits are connected with the timing controller and the plurality of clock signal lines, and are configured to adjust the first clock signal provided by the timing controller to a second clock signal, and output the second clock signal to the plurality of clock signal lines, and a falling duration of a falling edge of the second clock signal is less than a falling duration of a falling edge of the first clock signal; the gate driving circuit comprises a plurality of shift register units that are cascaded and is connected with the plurality of clock signal lines, respectively, and the gate driving circuit is configured to output the second clock signal as an output signal line by line, thereby shortening a falling duration of a falling edge of the output signal; and each of the plurality of anti-cross-row circuits includes at least one resistor and at least one inductor.

The display panel according to the embodiment of the present disclosure can form an inductive load by connecting an inductor in series between the timing controller and the gate driving circuit to offset the capacitive load on the clock signal line, so that there is only a resistive load on the clock signal line, so as to prevent the parasitic capacitance on the clock signal line from prolonging the falling duration of the falling edge of the clock signal, thereby avoiding cross-row display; in addition, by connecting a resistor in series between the timing controller and the gate driving circuit, the current on the clock signal line can be reduced, the heat generation of the clock signal line can be reduced, and the performance of the display panel can be improved.

The embodiments of the present disclosure and some examples thereof will be described in detail below with reference to the drawings.

Figure 2:
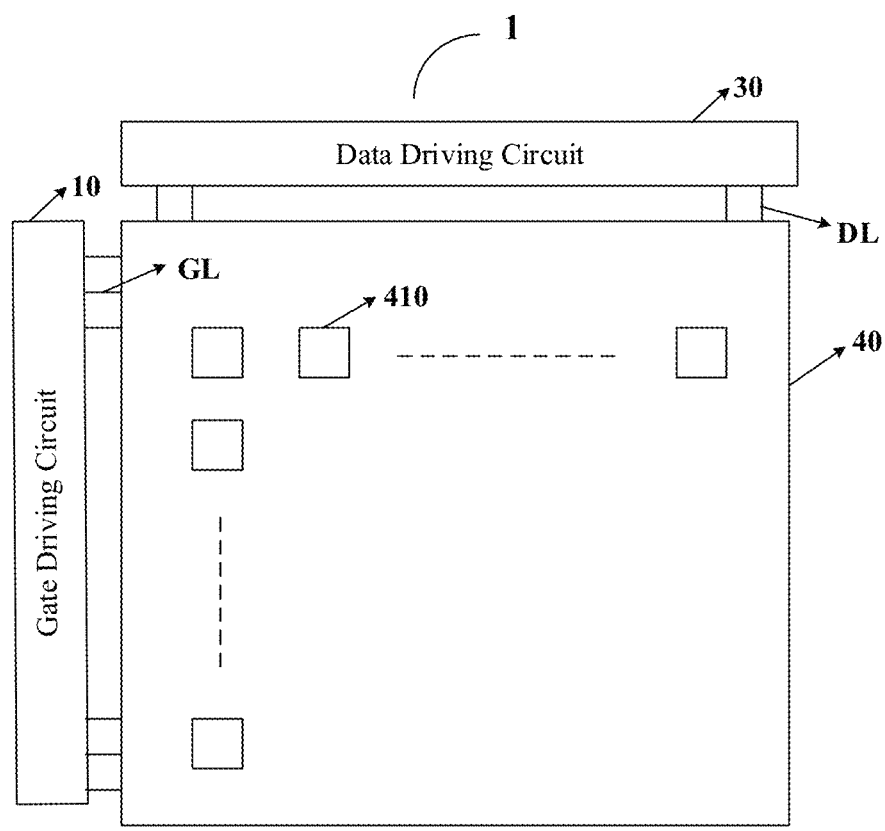
FIG. 2 is a schematic diagram of a display panel provided by at least one embodiment of the present disclosure.

FIG. 2 is a schematic diagram of a display panel provided by at least one embodiment of the present disclosure. For example, the display panel is a display panel with a resolution of 8K and a refresh rate of 120 Hz, or may be a display panel with other resolutions or refresh rates, which are not limited in the embodiments of the present disclosure. For example, as shown in FIG. 2, in some examples, the display panel 1 includes a gate driving circuit 10. For example, as shown in FIG. 2, in other examples, the display panel 1 further includes a display region 40, the display region 40 includes a pixel array connected to the gate driving circuit 10, and the pixel array includes a plurality of rows and a plurality of columns of sub-pixels 410. For example, in other examples, the display panel 1 further includes a data driving circuit 30 and a plurality of data lines DL. The plurality of data lines DL are electrically connected to the plurality of columns of sub-pixels 410 and configured to transmit data signals provided by the data driving circuit 30 to the plurality of columns of sub-pixels 410.

For example, the data driving circuit 30 is configured to provide data signals to the pixel array, and the gate driving circuit 10 is configured to provide gate scanning signals to the pixel array. The data driving circuit 30 is electrically connected to the sub-pixels 410 through a data line DL, and the gate driving circuit 10 is electrically connected to the sub-pixels 410 through a gate scanning signal line GL.

For example, the gate driving circuit is configured to drive a display panel such as a liquid crystal display panel, an organic light-emitting diode display panel, etc., and to sequentially provide gate scanning signals for a plurality of gate scanning signal lines of the display panel, so as to perform progressive scanning or interlaced scanning while the display panel displays one frame of pattern.

Figure 3:
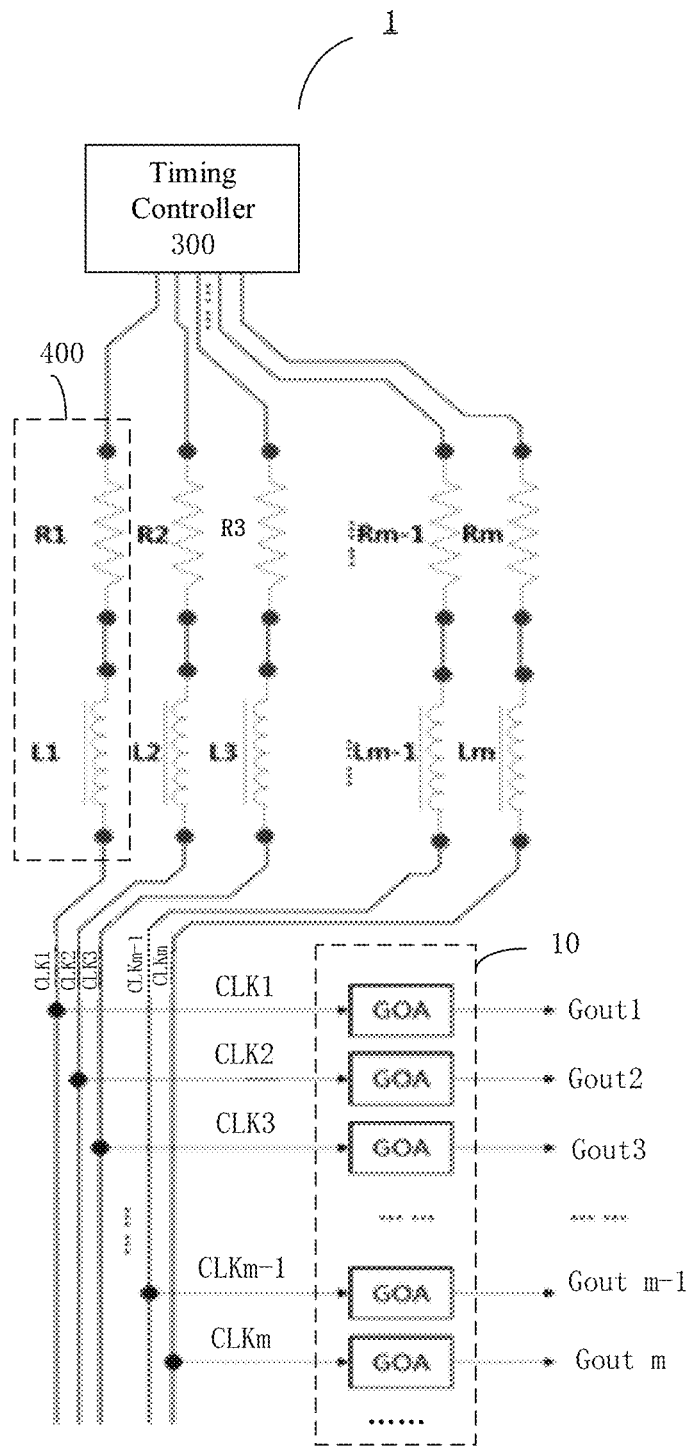
FIG. 3 is a schematic diagram of another display panel provided by at least one embodiment of the present disclosure.

FIG. 3 is a schematic diagram of another display panel provided by at least one embodiment of the present disclosure. For example, as shown in FIG. 3, on the basis of the example shown in FIG. 2, the display panel 1 further includes a plurality of clock signal lines CLK1 to CLKm (m is an even number greater than 0), a timing controller 300, and a plurality of anti-cross-row circuits. For clarity and conciseness, the display region 40 and the data driving circuit 30 are not shown in FIG. 3. For details, please refer to the description in FIG. 2, which will not be repeated here.

For example, m may be equal to 2, 4, 6, 12, 16, etc., that is, the plurality of clock signal lines may include 2, 4, 6, 12, 16, etc., and the amount of clock signal lines is an integer multiple of 2, which are not limited in the embodiments of the present disclosure. For example, the distance between the plurality of clock signal lines may be in a range from 4 μm to 100 μm, for example, form 4 μm to 20 μm, which are not limited in the embodiments of the present disclosure.

For example, the timing controller 300 is configured to provide a first clock signal.

For example, the plurality of anti-cross-row circuits 400 are connected with the timing controller 300 and the plurality of clock signal lines CLK1 to CLKm, and are configured to adjust the first clock signal provided by the timing controller 300 to a second clock signal, and output the second clock signal to the plurality of clock signal lines CLK1 to CLKm.

For example, in some examples, the plurality of anti-cross-row circuits 400 are connected with the plurality of clock signal lines in one-to-one correspondence, that is, one clock signal line is connected to one anti-cross-row circuit 400, which are not limited in the embodiments of the present disclosure.

Figure 10:
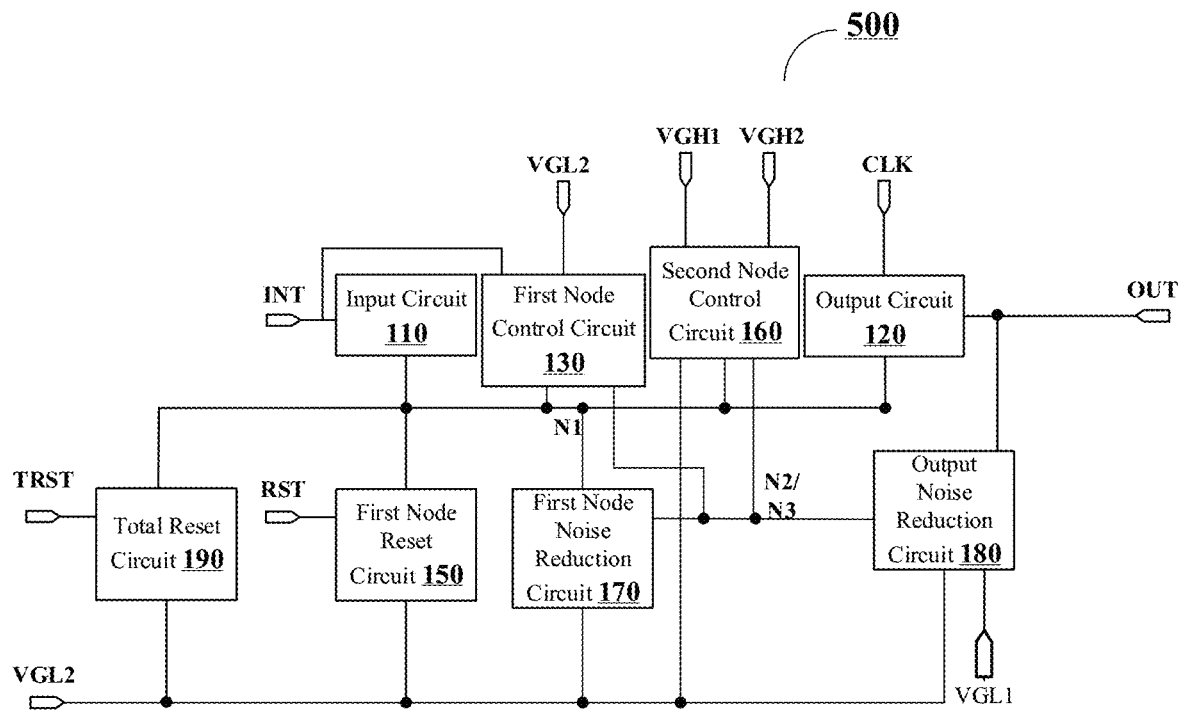
FIG. 10 is a schematic diagram of a shift register unit provided by an embodiment of the present disclosure.

For example, in other examples, the anti-cross-row circuit 400 may also be provided between the timing controller 300 and other power supply lines, for example, power supply lines that supply a first voltage to a fourth voltage to a first voltage terminal to a fourth voltage terminal shown in FIG. 10, to reduce peak current, etc., which are not limited in the embodiments of the present disclosure.

For example, as shown in FIG. 3, the gate driving circuit 10 includes a plurality of shift register units GOA that are cascaded, which are connected to the plurality of clock signal lines CLK1 to CLKm, respectively. The gate driving circuit 10 is configured to output the second clock signal as an output signal line by line, thereby shortening the falling duration of the falling edge of the output signal.

For example, in the case that m=12, as shown in FIG. 3, the plurality of clock signal lines include a first clock signal line CLK1, a second clock signal line CLK2, a third clock signal line CLK3, a fourth clock signal line CLK4, a fifth clock signal line CLK5, a sixth clock signal line CLK6, a seventh clock signal line CLK7, an eighth clock signal line CLK8, a ninth clock signal line CLK9, a tenth clock signal line CLK10, an eleventh clock signal line CLK11, and a twelfth clock signal line CLK12.

For example, as shown in FIG. 3, the first clock signal line CLK1 is connected to a clock signal terminal of a $(12n\text{-}11)$th-stage shift register; the second clock signal line CLK2 is connected to a clock signal terminal of a $(12n\text{-}10)$th-stage shift register; the third clock signal line CLK3 is connected to a clock signal terminal of a $(12n\text{-}9)$th-stage shift register; the fourth clock signal line CLK4 is connected to a clock signal terminal of a (12n-8)th-stage shift register; the fifth clock signal line CLK5 is connected to a clock signal terminal of a (12n-7)th-stage shift register; the sixth clock signal line CLK6 is connected to a clock signal terminal of a (12n-6)th-stage shift register; the seventh clock signal line CLK7 is connected to a clock signal terminal of a (12n-5)th-stage shift register; the eighth clock signal line CLK8 is connected to a clock signal terminal of a (12n-4)th-stage shift register; the ninth clock signal line CLK9 is connected to a clock signal terminal of a (12n-3)th-stage shift register; the tenth clock signal line CLK10 is connected to a clock signal terminal of a (12n-2)th-stage shift register; the eleventh clock signal line CLK11 is connected to a clock signal terminal of a (12n-1)th-stage shift register; and the twelfth clock signal line CLK12 is connected to a clock signal terminal of a (12n)th-stage shift register, where N is an integer greater than or equal to 1.

It should be noted that the connection mode between the clock signal lines of other numbers and the shift register units is similar to that of the 12 clock signal lines, which will not be repeated here; of course, other connection modes may also be used, which are not limited in the embodiments of the present disclosure.

Figure 4A:
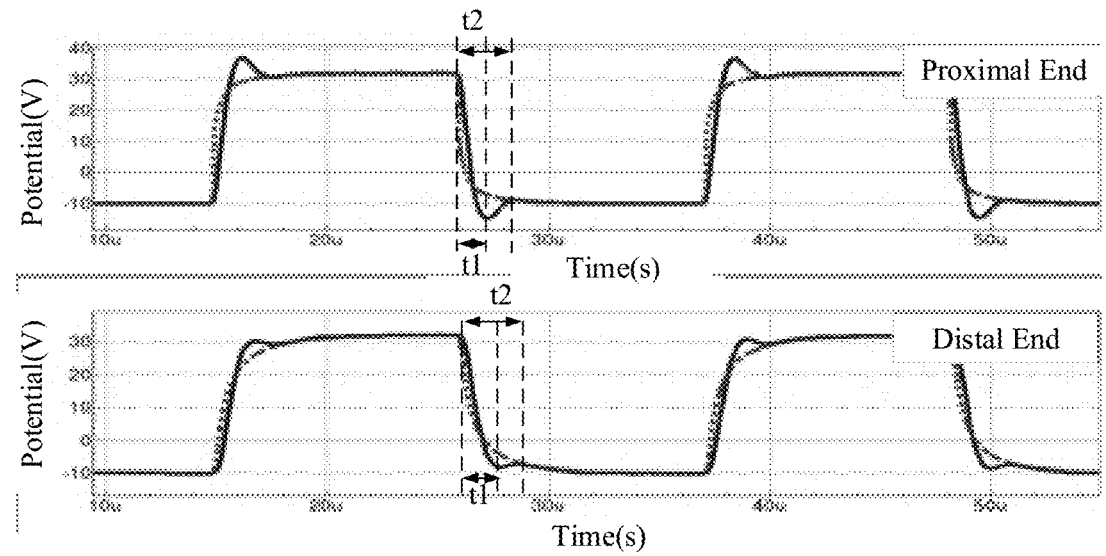
FIG. 4A is a schematic diagram of a first clock signal and a second clock signal provided by at least one embodiment of the present disclosure.
Figure 4B:
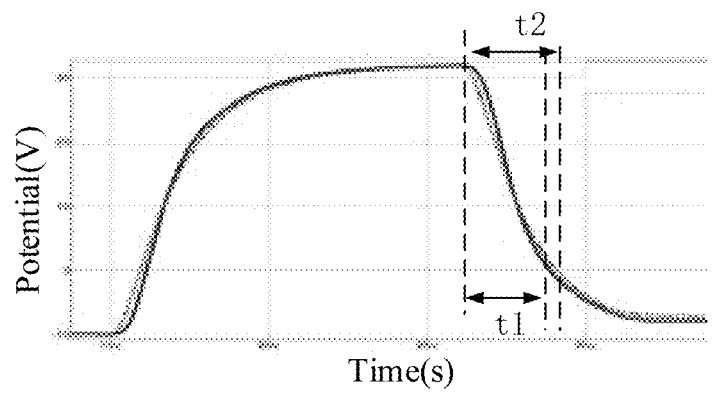
FIG. 4B is a schematic diagram of an output signal output by a gate driving circuit before and after adding an anti-cross-row circuit provided by at least one embodiment of the present disclosure.

FIG. 4A is a schematic diagram of a first clock signal and a second clock signal provided by at least one embodiment of the present disclosure; FIG. 4B is a schematic diagram of an output signal output by a gate driving circuit before and after adding an anti-cross-row circuit 400 provided by at least one embodiment of the present disclosure. For example, as shown in FIG. 4A, the upper and lower waveform diagrams are a comparison diagram of the first clock signal and the second clock signal at the proximal end of the timing controller 300 and a comparison diagram of the first clock signal and the second clock signal at the distal end of the timing controller 300, respectively.

For example, as shown in FIG. 4A, the falling duration t1 of the falling edge of the second clock signal (the waveform shown by the solid line in FIG. 4A) is less than the falling duration t2 of the falling edge of the first clock signal (the waveform shown by the dotted line in FIG. 4A).

For example, as shown in FIG. 4B, the solid line is the second clock signal output by the gate driving circuit and is used as the output signal, and the dotted line is the first clock signal output by the gate driving circuit and is used as the output signal. As shown in FIG. 4B, in the case where the gate driving circuit 10 outputs the second clock signal as the output signal line by line, the falling duration of the falling edge of the output signal is shortened from t2 to t1, so that the occurrence of the cross-row phenomenon can be avoided.

Figure 4C:
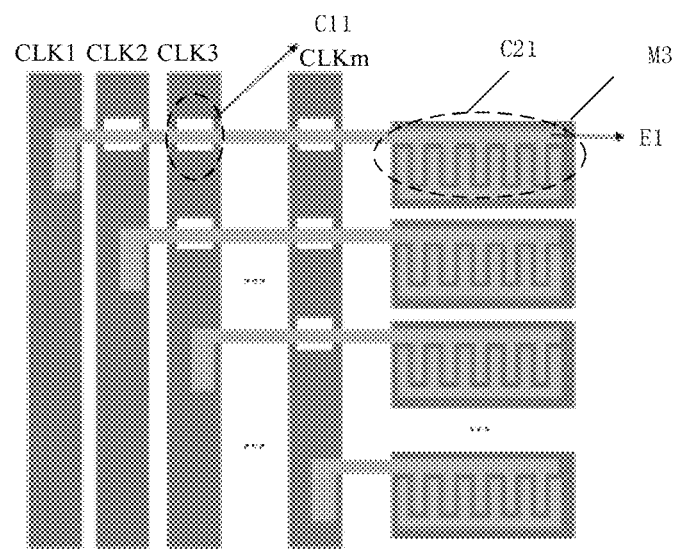
FIG. 4C is a schematic diagram of a parasitic capacitance of a clock signal line provided by at least one embodiment of the present disclosure.

FIG. 4C is a schematic diagram of a parasitic capacitance of a clock signal line according to at least one embodiment of the present disclosure.

For example, as shown in FIG. 4C, the capacitance load of the clock signal line CLK1 comes from a parasitic capacitance C11 generated at an overlap between a connection electrode E1 of the clock signal line CLK1 and the clock signal lines CLK2-CLKm connected to different shift register units, and a parasitic capacitance C21 generated at an overlap between a gate electrode of an output transistor (the third transistor T3 shown in FIG. 12) of the shift register unit and the connection electrode E1. In some embodiments of the present disclosure, by connecting an inductor in series on the clock signal line to introduce an inductive load, the capacitive load (e.g., parasitic capacitances C11 and C21) of the clock signal line can be offset, so that the impedance of the clock signal is reduced, the falling duration of the falling edge of the clock signal is reduced, and the falling duration of the falling edge of the output signal is reduced, so that the occurrence of the cross-row phenomenon can be avoided.

It should be noted that, for clarity and conciseness, only the clock signal line CLK1 is taken as an example for description above, and other clock signal lines CLK2-CLKm are similar to the clock signal line CLK1, which will not be described here.

For example, each of the plurality of anti-cross-row circuits 400 includes at least one resistor and at least one inductor. For example, at least one resistor and at least one inductor are connected in series or in parallel.

For example, the total resistance value of the equivalent resistance of each anti-cross-row circuit 400 is in a range from 1 ohm ($\Omega$) to 1000 ohm, and the total inductance of the equivalent inductance of each anti-cross-row circuit is in a range from 1 microhenry to 1000 microhenry. For example, in some examples, the total resistance value of the equivalent resistance of each anti-cross-row circuit 400 is 150$\Omega$, and the total inductance value of each equivalent inductance is 100 microhenry. Of course, it can also be other values, which may be determined by referring to the actual situation and are not limited in the embodiments of the present disclosure.

For example, a first end of the at least one resistor is connected to the timing controller 300, and a second end of the at least one resistor is connected to the at least one inductor.

For example, as shown in FIG. 3, the anti-cross-row circuit 400 connected to the clock signal line CLK1 includes a resistor R1 and an inductor L1. For example, the anti-cross-row circuit 400 connected to the clock signal line CLK2 includes a resistor R2 and an inductor L2; the anti-cross-row circuit 400 connected to the clock signal line CLK3 includes a resistor R3 and an inductor L3; the anti-cross-row circuit 400 connected to the clock signal line CLKm-1 includes a resistor Rm-1 and an inductor Lm-1; and the anti-cross-row circuit 400 connected to the clock signal line CLKm includes a resistor Rm and an inductance Lm.

For example, the first ends of the resistors R1-Rm are connected to the timing controller 300, the second ends of the resistors R1-Rm are connected to the first ends of the inductors L1-LM, respectively, and the second ends of the inductors L1-LM are connected to the plurality of clock signal lines CLK1-CLKm in one-to-one correspondence, respectively.

For example, the resistance values of the above-mentioned resistors may be equal, for example, the resistance value of the resistor R1 is equal to the resistance value of the resistor R2, is equal to the resistance value of the resistor R3, is equal to the resistance value of the resistor Rm-1, is equal to the resistance value of the resistor Rm, for example, is equal to 150$\Omega$. Of course, the resistance values of the above-mentioned resistors may not be equal, for example, it may be determined according to the distance between the timing controller 300 and the clock signal line. The greater the distance between the timing controller 300 and the clock signal line, the smaller the resistance value, for example, the resistance value of the resistor R1 is smaller than the resistance value of the resistor R2, and the resistance value of the resistor R2 is smaller than the resistance value of the resistor Rm. The specific situation may depend on the actual situation, which are not limited in the embodiments of the present disclosure.

For example, the inductance value of each of the above-mentioned inductors may be equal, for example, the inductance value of the inductor L1 is equal to the inductance value of the inductor L2, is equal to the inductance value of the inductor L3, is equal to the inductance value of the inductor L3m-1, is equal to the inductance value of the inductor Lm, for example, is equal to 100 microhenry. Of course, the inductance value of each of the above-mentioned inductors may not be equal, for example, it may be determined according to the distance between the timing controller 300 and the clock signal line. The greater the distance between the timing controller 300 and the clock signal line, the smaller the inductance value. For example, the inductance of the inductor L1 is smaller than the inductance of the inductor L2, and the inductance of the inductor L2 is smaller than the inductance of the inductor Lm. The specific situation may depend on the actual situation, which are not limited in the embodiments of the present disclosure.

It should be noted that, for clarity and conciseness, FIG. 3 only shows the case where the at least one resistor includes one resistor, the at least one inductor includes one inductor, and the resistor and the inductor are connected in series. However, the embodiments of the present disclosure are not limited to this, and may include more resistors and inductors.

Figure 4D:
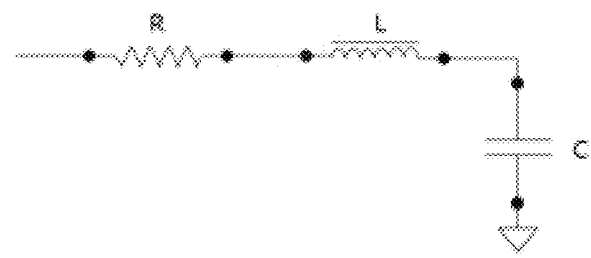
FIG. 4D is a schematic diagram of a circuit load model provided by at least one embodiment of the present disclosure.
Figure 4E:
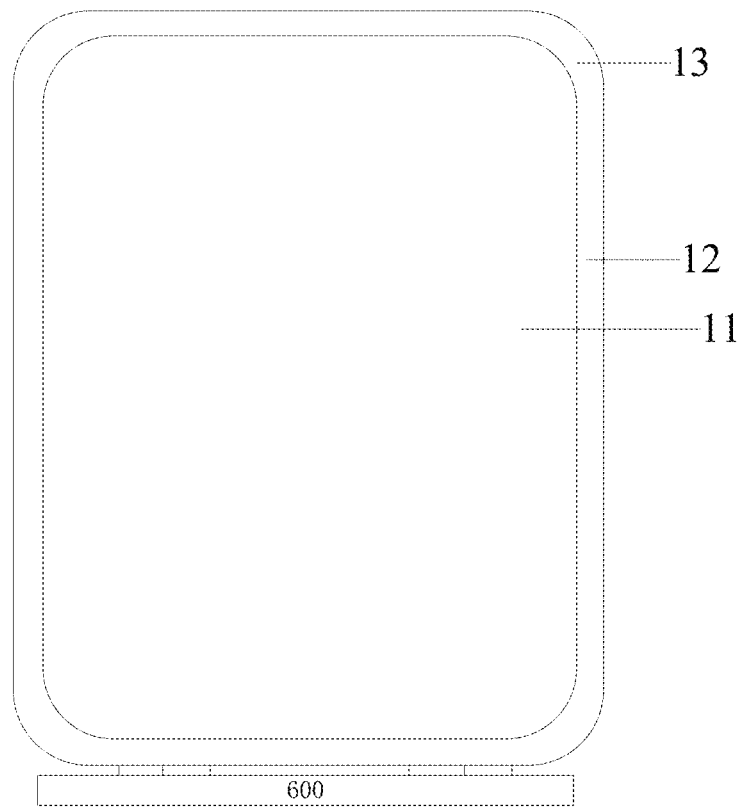
FIG. 4E is a schematic diagram of a plan view of a display panel provided by at least one embodiment of the present disclosure.

FIG. 4E is a schematic diagram of a plan view of a display panel according to at least one embodiment of the present disclosure. As shown in FIG. 4E, the display panel includes a display region 11 and a peripheral region 12 surrounding the display region 11. For example, where the peripheral region 12 is bent, the peripheral region 12 includes the corner part 13. For example, the display region 11 includes a plurality of pixels arranged in array for receiving output signals of the gate driving circuit as gate scanning signals for display. The peripheral region 12 includes structures such as the gate driving circuit 10 that drives the plurality of sub-pixels in the display region 11 to display, the plurality of clock signal lines, etc.

For example, as shown in FIG. 4E, the display panel further includes a circuit board 600. For example, the timing controller 300 and the anti-cross-row circuit 400 are provided on the circuit board 600. The specific settings may refer to the settings in the art, and will not be described herein.

In some examples, the resistor R1 is connected in series on the clock signal line between the timing controller 300 and the inductor L1, which can reduce the temperature of the corner part of the display panel, and prevent the display panel from heating up seriously and causing blackening problem and fire hazards. For the display products with a resolution of 8K and a refresh rate of 120 Hz, due to the high frequency of the signal transmitted by the clock signal line, the driving ability of the shift register unit GOA is strong, and the current on the clock signal line is large. The corner part of the display panel is densely wired due to the turn of the clock signal line wiring, and considering the frame, the temperature of the corner part is relatively high. The verification data test shows that when the display panel with the resolution of 8K and the refresh rate of 120 Hz works, the temperature of the corner part can reach more than 70° C., and the temperature of the corner part of the display panel can be reduced to 50° C. by connecting the resistor in series. Therefore, connecting the resistor in series on the clock signal line can reduce the temperature of the corner part of the display panel, improve the user experience, and prolong the service life of the display panel.

Because all passive devices can be equivalent to a series connection of resistor and inductor and/or a parallel connection of resistor and capacitor. Therefore, as shown in FIG. 3, the resistors and inductors connected in series are examples of including the least devices. In other examples, for example, the inductors are connected in parallel next to the resistors, and the resistors are connected in parallel next to the inductors, which both belong to the protection scope of the present disclosure, and are not limited in the embodiments of the present disclosure.

Figure 5:
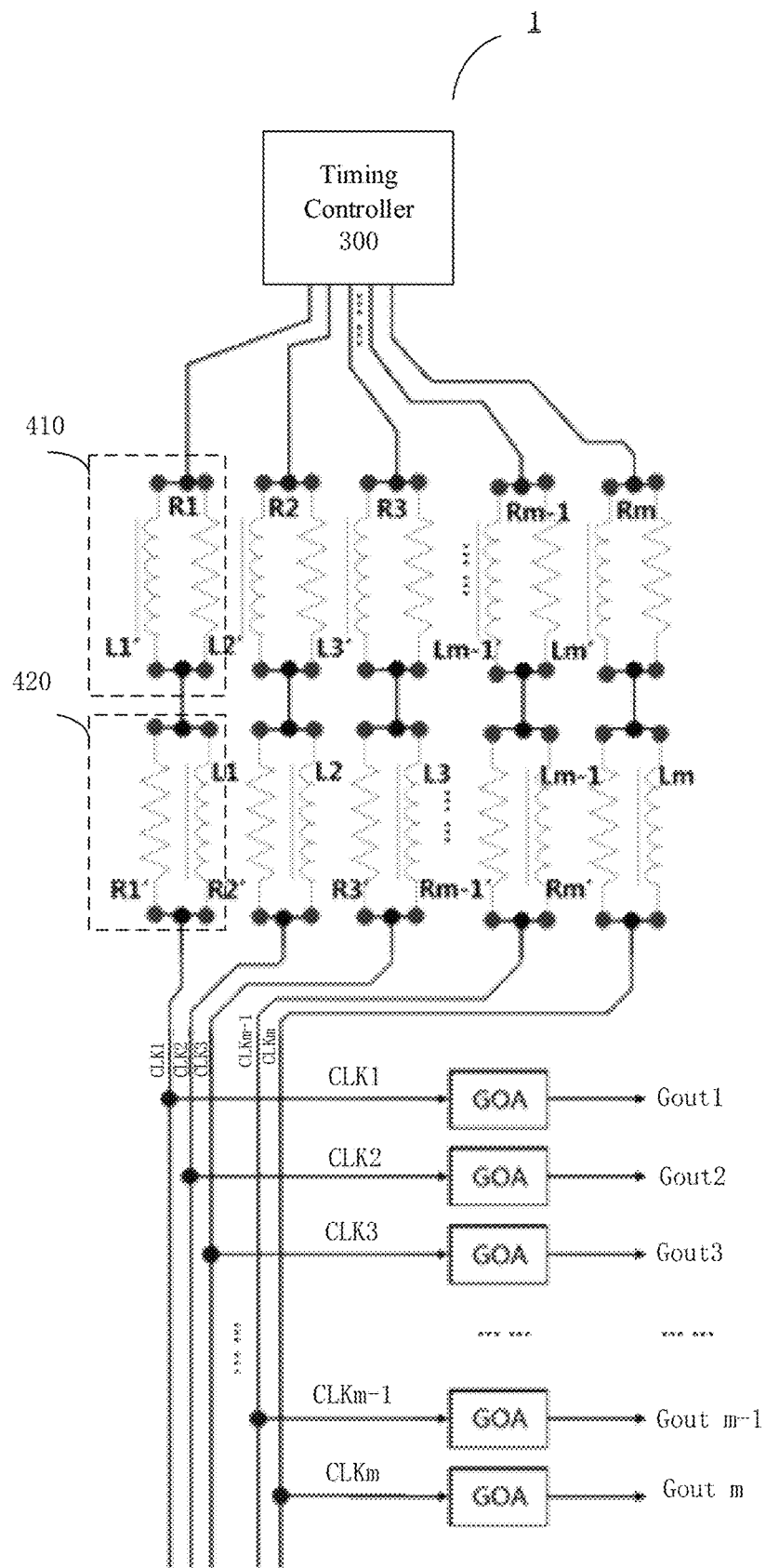
FIG. 5 is a schematic diagram of yet another display panel provided by at least one embodiment of the present disclosure.

FIG. 5 is a schematic diagram of another display panel provided by at least one embodiment of the present disclosure. For example, as shown in FIG. 5, in this example, at least one resistor includes a first resistor R1 and a second resistor R1', and at least one inductor includes a first inductor L1' and a second inductor L1. The first resistor R1 and the first inductor L1' are connected in parallel to form a first element 410, and the second resistor R1' and the second inductor L1 are connected in parallel to form a second element 420. For example, as shown in FIG. 5, the first element 410 and the second element 420 are connected in series.

For example, in this example, the first element 410 and the second element 420 may be equivalent to inductors, and the total inductance value of the equivalent inductance of the first element 410 and the equivalent inductance of the second element 420 is in a range from 1 microhenry to 1000 microhenry; alternatively, in other examples, in the case where the first element and the second element are equivalent to resistors, the total resistance value of the equivalent resistance of the first element and the equivalent resistance of the second element is in a range from 1 ohm to 1000 ohm.

For example, in other examples, the first element 410 or the second element 420 may include a plurality of resistors which are connected in series or in parallel. For example, in the case where the anti-cross-row circuit 400 includes only one resistor, the resistance value of the resistor is in a range from 1 ohm to 1000 ohm; and in the case where the anti-cross-row circuit 400 includes two resistors connected in parallel, the resistance value of each resistor may be 2000 ohm, so that the resistance value of the two resistors connected in parallel is 1000 ohm, as long as the resistance value of the equivalent resistance of the first element 410 or the equivalent resistance of the second element 420 (i.e., the total resistance value of the equivalent resistance of the anti-cross-row circuit 400) is in a range from 1 ohm to 1000 ohm, which are not limited in the embodiments of the present disclosure.

For example, in other examples, the first element 410 or the second element 420 may include a plurality of inductors which are connected in series or in parallel. For example, in the case where the anti-cross-row circuit 400 includes only one inductor, the inductance value of the inductor is in a range from 1 microhenry to 1000 microhenry; and when the anti-cross-row circuit 400 includes a plurality of inductors connected in series or in parallel, the resistance value of each inductor may be adjusted according to actual situations, as long as the total inductance value of the equivalent inductance of the first element 410 or the equivalent inductance of the second element 420 (i.e., the total inductance value of the equivalent inductance of the anti-cross-row circuit 400) is in a range from 1 microhenry to 1000 microhenry, which are not limited in the embodiments of the present disclosure.

FIG. 4D is a schematic diagram of a circuit load model provided by at least one embodiment of the present disclosure. For example, as shown in FIG. 4D, for a circuit network, the load may be abstracted as an RLC network, and the impedance of the network is:

$$Z = R + j\left(wL - \frac{1}{wC}\right),$$

where the real part R is a resistance, the imaginary part $$wL - \frac{1}{wC}$$

is a reactance, w=2πf is an angular frequency, f is a signal frequency, and j is an imaginary unit.

For example, the impedance amplitude is a mode of Z. It can be seen from this formula that when the C in the circuit is constant, the circuit impedance Z can be reduced by increasing the inductance L. When $$wL = \frac{1}{wC},$$

the circuit impedance is the smallest, which is equal to the resistance value R. After that, the inductance is increased again, and the impedance starts to increase again.

The display panel of the above-mentioned embodiment of the present disclosure can form an inductive load by connecting an inductor in series between the timing controller and the gate driving circuit to offset the capacitive load on the clock signal line, so that there is only the resistive load on the clock signal line, so as to prevent the parasitic capacitance on the clock signal line from prolonging the falling duration of the falling edge of the clock signal. In addition, by connecting a resistor in series between the timing controller and the gate driving circuit, the current on the clock signal line can be reduced, the heat generation of the clock signal line can be reduced, and the performance of the display panel can be improved.

Figure 6:
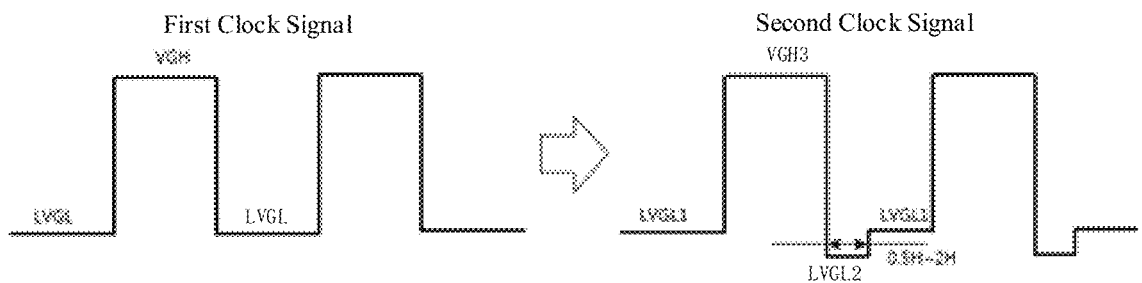
FIG. 6 is a schematic diagram of waveforms of a first clock signal and a second clock signal provided by at least one embodiment of the present disclosure.
Figure 7:
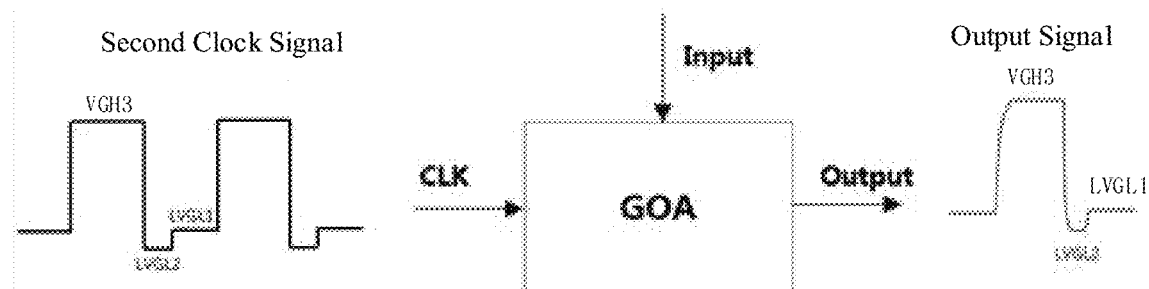
FIG. 7 is a schematic diagram of waveforms of a second clock signal and an output signal provided by at least one embodiment of the present disclosure.
Figure 8:
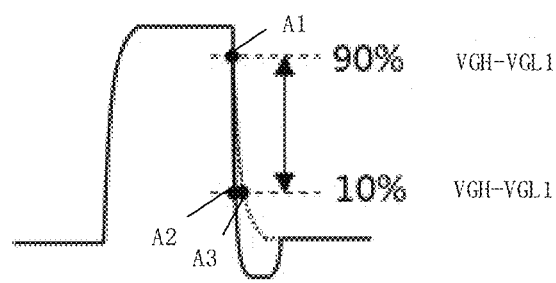
FIG. 8 is an enlarged schematic diagram of an output signal provided by at least one embodiment of the present disclosure.

FIG. 6 is a schematic diagram of waveforms of a first clock signal and a second clock signal provided by at least one embodiment of the present disclosure; FIG. 7 is a schematic diagram of waveforms of a second clock signal and an output signal provided by at least one embodiment of the present disclosure; and FIG. 8 is an enlarged schematic diagram of an output signal provided by at least one embodiment of the present disclosure.

For example, for the gate driving circuit, the waveform of the output signal output by the output terminal depends on an input waveform of the gate driving circuit, that is, depends on the waveform of the second clock signal provided by the clock signal line. For example, the waveform of the second clock signal provided by the clock signal line includes multi-level levels, so that the waveform of the output signal output by the output terminal of the gate driving circuit also includes multi-level levels. For example, as shown in FIG. 7, the multi-level levels refer to one low level including multi-level low levels or one high level including multi-level high levels, which are not limited in the embodiments of the present disclosure.

For example, the second clock signal with multi-level levels can solve the problem that the falling duration of the falling edge of the output signal is long. For example, the falling duration of the falling edge of the output signal is determined according to 10% (VGH-VGL1) to 90% (VGH-VGL1) of the falling edge of the output signal. Because the waveform of the output signal becomes multi-level levels, the falling edge of the output signal forms an undershoot, so the falling duration of the falling edge of the output signal becomes small. For example, VGH is the first level as shown in FIG. 6, and VGL1 is the first voltage provided by the first voltage terminal as shown in FIG. 10. When the output noise reduction circuit 180 shown in FIG. 10 is turned on due to a low level output by the output terminal of the shift register unit, the first voltage provided by the first voltage terminal VGL1 is output to the output terminal. Therefore, the undershoot height of the falling edge is taken as VGH-VGL1.

For example, in some examples, the first clock signal includes a first level VGH and a second level LVGL sequentially arranged in a time domain, and the second clock signal includes a third level VGH3 and a fourth level sequentially arranged in the time domain; the first level VGH is higher than the second level LVGL, and the third level VGH3 is higher than the fourth level; the fourth level includes a first sub-level LVGL1 and a second sub-level LVGL2; and in the time domain, the second sub-level LVGL2 is between the third level VGH3 and the first sub-level LVGL1. For example, in some examples, the second sub-level LVGL2 is lower than the first sub-level LVGL1, so that the falling edge of the second clock signal may form an undershoot from the third level VGH3 to the second sub-level LVGL2, thereby shortening the falling duration of the falling edge.

For example, in some examples, the first sub-level LVGL1=−10V (volt), the second sub-level LVGL2=−15V, and of course may be other values. For example, the value range of the first sub-level and the second sub-level may be in the range from −4V to −20V, which depends on the actual situation and is not limit in the embodiments of the present disclosure.

For example, the first sub-level LVG1 is equal to the first voltage provided by the first voltage terminal VGL1 as shown in FIG. 10, for example, both of them are −10V, and the second voltage provided by the second voltage terminal VGL2 as shown in FIG. 10, for example, is −8V. The specific situation may depend on the actual situation, which is not limited in the embodiments of the present disclosure.

For example, in some embodiments of the present disclosure, the first level VGH and the third level VGH3 are high levels, and the second level LVGL and the fourth level are low levels. The following embodiments are the same as this and will not be described again.

For example, as shown in FIG. 6, the first level VGH and the third level VGH3 are equal or substantially equal, and the first sub-level LVGL1 and the second level LVGL are equal or substantially equal, which are not limited in the embodiments of the present disclosure.

For example, as shown in FIG. 8, because the gate driving circuit outputs the second clock signal as the output signal, the falling edge of the output signal also forms an undershoot from the third level VGH3 to the second sub-level LVGL2, so that the falling duration of the falling edge of the output signal can be shortened, and the falling duration of the falling edge of the output signal is shortened from a first time (i.e., the falling duration is the distance between A1 and A3 in the horizontal direction) to a second time (i.e., the falling duration is the distance between A1 and A2 in the horizontal direction).

Figure 9:
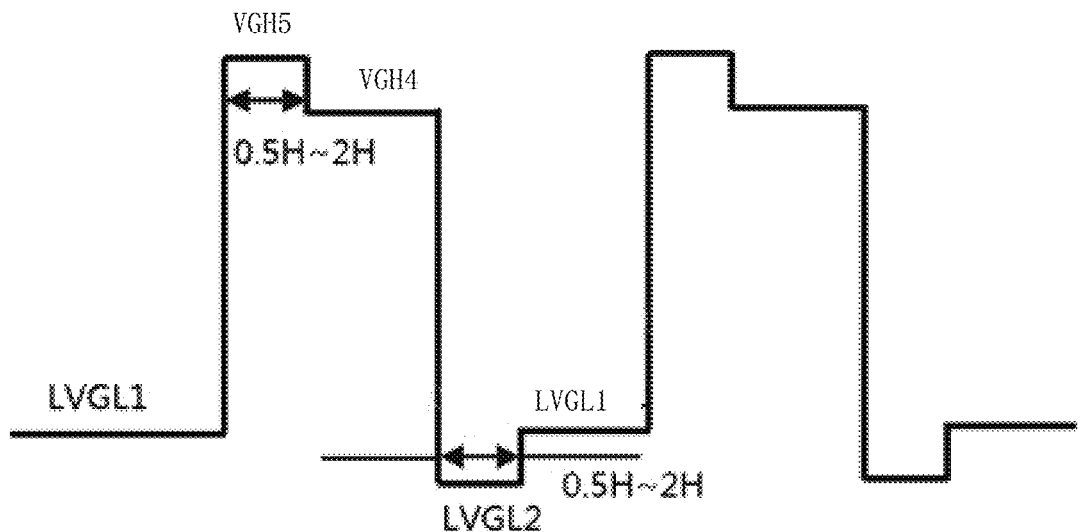
FIG. 9 is a schematic diagram of another second clock signal provided by at least one embodiment of the present disclosure.

FIG. 9 is a schematic diagram of another second clock signal provided by at least one embodiment of the present disclosure.

For example, as shown in FIG. 9, in other examples, the third level VGH3 includes a third sub-level VGH5 and a fourth sub-level VGH4. In the time domain, the fourth sub-level VGH4 is between the third sub-level VGH5 and the second sub-level LVGL2, that is, in the time domain, the third sub-level VGH5 precedes the fourth sub-level VGH4, the fourth sub-level VGH4 precedes the second sub-level LVGL2, and the second sub-level LVGL2 precedes the first sub-level LVGL1.

Figure 11:
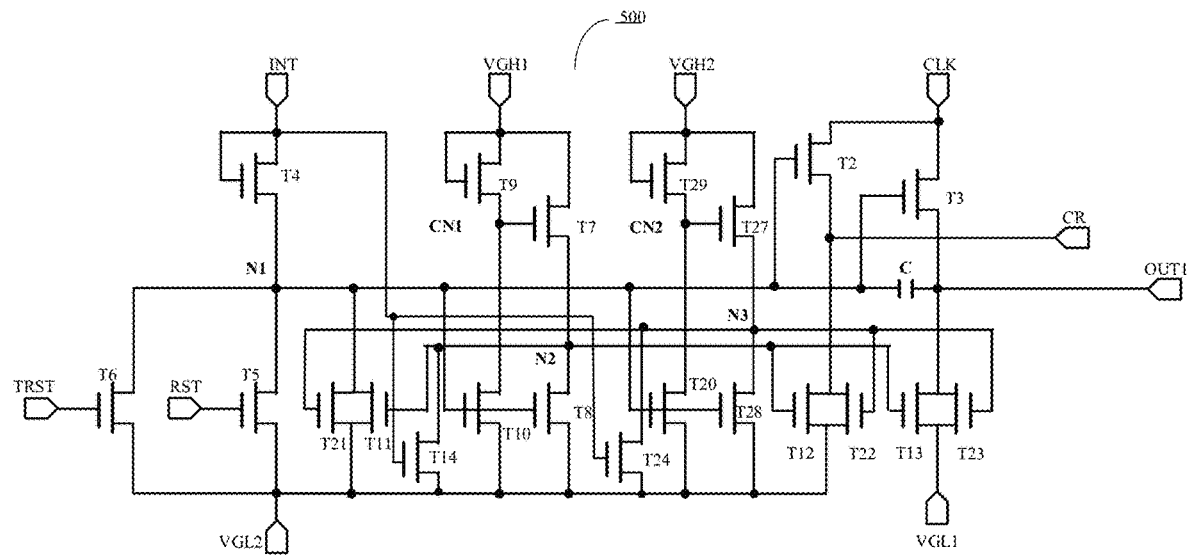
FIG. 11 is a circuit diagram of a specific implementation example of the shift register unit shown in FIG. 10.
Figure 12:
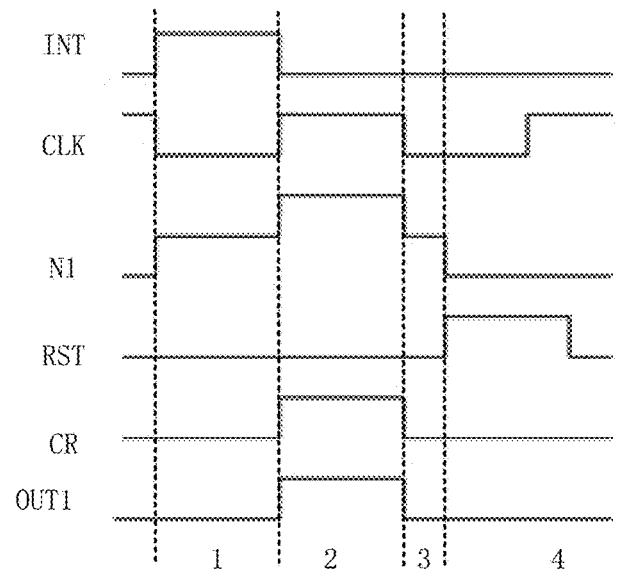
FIG. 12 is a driving timing diagram of a shift register unit provided by at least one embodiment of the present disclosure.

For example, the third sub-level VGH5 is higher than the fourth sub-level VGH4, so that when the third sub-level VGH5 of the second clock signal is output, according to the law of charge conservation of the capacitor, the voltage of the gate electrode (i.e., the N1 node as shown in FIG. 12) of the third transistor T3 may be increased, so that the third transistor T3 can be turned on more thoroughly. For details, please refer to the descriptions of FIG. 10-FIG. 12 below and will not be repeated here.

For example, in some examples, the fourth sub-level VGH4 and the first level VGH are equal or substantially equal, that is, the fourth sub-level VGH4 and the third level VGH3 are equal or substantially equal, which are not limited in the embodiments of the present disclosure.

For example, as shown in FIG. 6 and FIG. 9, widths of the second sub-level LVGL2 and the third sub-level VGH5 may be 0.5H-m/2H, or 0.5H-2H, and 1H is the charging duration of one row of pixels. For example, in the case where 12 clock signal lines are included, that is, m=12, the widths of the second sub-level LVGL2 and the third sub-level VGH5 may be less than or equal to 6H, that is, six times the charging duration of one row of sub-pixels. The specific width range may be determined according to the actual situation, which is not limited in the embodiments of the present disclosure.

For example, in some examples, the waveform of the second clock signal may directly form a undershoot of VGH5-LVGL2 at the falling edge without adopting multi-level levels. For example, in this example, the first clock signal includes the first level and the second level sequentially arranged in the time domain, the second clock signal includes the third level and the fourth level sequentially arranged in the time domain. The first level is higher than the second level, and the third level is higher than the fourth level. The second level is higher than the fourth level, and the third level is higher than the first level.

For example, the first level is VGH as shown in FIG. 6, the second level is LVGL as shown in FIG. 6, the third level is VGH5 as shown in FIG. 9, and the fourth level is LVGL2 as shown in FIG. 6 or FIG. 9. The widths of the above-mentioned four levels are all m/2H.

In this embodiment, because the falling edge of the waveform of the second clock signal forms the undershoot of VGH5-LVGL2, which is larger than the undershoot VGH-LVGL at the falling edge of the first clock signal, so that the falling duration of the falling edge is shortened.

For example, the first level VGH, the third level VGH3, the third sub-level VGH5 and the fourth sub-level VGH4 included in the third level VGH3, the third voltage provided by the third voltage terminal VGH1 as shown in FIG. 10, and the fourth voltage provided by the fourth voltage terminal VGH2 as shown in FIG. 10 may all have the value range of 25V-40V. For example, in the example as shown in FIG. 9, the first level VGH is 32V, the third sub-level VGH5 is 36V, and the fourth sub-level VGH4 is 32V; and in the example shown in FIG. 6, the third level VGH3 is 32V, which can be determined according to the actual situation and are not limited in the embodiment of the present disclosure.

For example, in other examples, the display panel further includes a level conversion circuit (not shown), which is configured to convert a logic level signal into the first clock signal or configured to convert the first clock signal into the above-mentioned second clock signal having a signal with multi-level levels shown in FIG. 6 or FIG. 9.

For example, in some examples, the level conversion circuit can convert a logic level into the first clock signal having a signal with multi-level levels, and then output the first clock signal to the anti-cross-row circuit 400, and the anti-cross-row circuit outputs the second clock signal having a signal with multi-level levels to the plurality of clock signal lines. In other examples, the level conversion circuit can convert the first clock signal into the second clock signal having a signal with multi-level levels as shown in FIG. 6 or FIG. 9, and then input the second clock signal to the anti-cross-row circuit. Alternatively, after receiving the second clock signal from the anti-cross-row circuit, the second clock signal may be set as a signal with multi-level levels through the level conversion circuit and then the second clock signal having a signal with multi-level levels may be output to the plurality of clock signal lines, which are not limited in the embodiments of the present disclosure.

For example, the clock signal adopts a multi-level levels design of one high level with multi-level low levels or multi-level high levels with multi-level low levels, which can enable the second clock signal to form an undershoot to reduce the delay of the falling duration of the falling edge, thereby shortening the falling duration of the falling edge of the output signal. Therefore, the driving ability of the gate driving circuit can be enhanced to a certain extent, and can be used for driving all products, such as display products with a resolution of 4K, display products with a resolution of 8K, or COF (Chip On Flex or Chip On Film) products, etc.

For example, in some embodiments, only the multi-level levels design of the clock signal is adopts and the driving ability of the shift register unit can enhanced to a certain extent.

For example, in other examples, only resistors may be connected in series between the timing controller 300 and the plurality of signal lines, which can effectively reduce the current on the clock signal lines and greatly reduce the temperature at the corner part of the display panel. In these examples, the display panel is applicable to products with a small number of clock signal lines but a high charging rate.

For example, in other examples, only inductors may be connected in series between the timing controller 300 and the plurality of signal lines, and the inductance value is, for example, in the range from 10 microhenry to 500 microhenry, which can greatly reduce the delay of the clock signal line and improve the driving ability of the shift register unit. In these examples, the display panel is applicable to products whose charging rate needs to be increased and the GOE edge is insufficient, and may also be applicable to products with horizontal stripes on the pattern.

It should be noted that the above-mentioned embodiments may be combined arbitrarily, which is not limited in the embodiments of the present disclosure.

For example, the shift register unit may adopt a circuit structure in the art, for example, 4T1C, 10T4C, 21T1C, etc., which is not limited in the embodiments of the present disclosure, and the specific driving process may refer to conventional introduction in the art, and will not be described here.

FIG. 10 is a schematic diagram of a shift register unit provided by an embodiment of the present disclosure. As shown in FIG. 10, the shift register unit 500 includes an input circuit 110, an output circuit 120, a first node N1, and a first node control circuit 130. A gate driving circuit can be obtained by cascading a plurality of the shift register units 500. The gate driving circuit is configured to drive a display panel, and sequentially provide scanning signals to a plurality of gate lines of the display panel, so that the progressive scanning or interlaced scanning is performed during a period when the display panel displays a frame of pattern.

As shown in FIG. 10, the input circuit 110 is connected to the first node N1 (for example, a pull-up node here), and is configured to charge the first node N1 in response to an input signal. For example, in some examples, the input circuit 110 is connected to an input signal terminal INT and the first node N1, and is configured to be turned on under the control of the input signal provided by the input signal terminal INT, so as to enable the input signal terminal INT to be connected to the first node N1, so that the input signal provided by the input signal terminal INT is input to the first node N1, and the potential of the first node N1 is charged (e.g., pulled up) to an working potential.

The output circuit 120 includes an output terminal OUT connected to the first node N1, and is configured to output an output signal at the output terminal OUT under the control of a level of the first node N1. For example, in some examples, the output circuit 120 is connected to a clock signal terminal CLK, the first node N1, and the output terminal OUT, and is configured to be turned on under the control of the level of the first node N1, transmit a second clock signal provided by the clock signal terminal CLK to the output terminal OUT, and the second clock signal is output as the output signal at the output terminal OUT. Alternatively, in another example, the output circuit 120 is further connected to a voltage terminal, and the second clock signal provided by the clock signal terminal CLK is used as a control signal to control whether the voltage terminal is connected to the output terminal OUT, thereby controlling whether a voltage signal of the voltage terminal is transmitted to the output terminal OUT and output as the output signal at the output terminal OUT.

For example, the clock signal terminal CLK is connected to one of clock signal lines CLK1-CLKm to receive the second clock signal, thereby outputting the second clock signal to the output terminal OUT as the output signal.

For example, the output terminal OUT may include a plurality of output terminals, such as a shift output terminal and at least one scanning signal output terminal, so as to output the output signal, such as the second clock signal provided by the clock signal terminal CLK, to the shift output terminal and the scanning signal output terminal, so as to improve the driving ability of the shift register unit 500. For example, in the shift register unit provided by at least one embodiment of the present disclosure, the at least one scanning signal output terminal includes one scanning signal output terminal. For example, the shift output terminal is configured to provide an input signal and a reset signal to the next-stage shift register unit 500, and the scanning signal output terminal is configured to provide a driving signal to the pixel circuits of one row of pixel units in the display panel. In this way, the influence of a load and signal in the pixel region on the shift register units that are cascaded may be reduced. For example, the shift output terminal and the scanning signal output terminal output the same output signal. It should be noted that in other examples, in the case where a plurality of scanning signal output terminals are included, each scanning signal output terminal may also output different output signals. The specific settings are determined according to the actual situation, which are not limited in the embodiments of the present disclosure.

The first node control circuit 130 is connected to the second node N2 and the third node N3, respectively, and is configured to control levels of the second node N2 and the third node N3 in response to the input signal. For example, the first node control circuit 130 is configured to be connected to the second node N2, the third node N3, a second voltage terminal VGL2 (for example, providing a low level) or a separately provided voltage terminal (for example, a low voltage terminal) and the input terminal INT, so that the second node N2 and the third node N3 are electrically connected to the second voltage terminal VGL2 or the low voltage terminal under the control of the input signal input by the input terminal INT, so as to ensure that the levels of the second node N2 and the third node N3 are pulled down to a second voltage at the stage of pulling up the first node N1.

It should be noted that "active output level" of the shift register unit provided in the embodiment of the present disclosure refers to a level at which a switching transistor in the pixel circuit of the display panel connected to the shift register unit can be turned on so that a data signal can be written into the pixel circuit. Accordingly, "inactive output level" refers to a level that cannot cause the switching transistor in the pixel circuit connected to the shift register unit to be turned on (ie, the switching transistor is turned off). The active output level is higher or lower than the inactive output level depending on factors such as the type (N-type or P-type) of the switching transistor in the pixel circuit. Generally, the shift register unit outputs a square wave pulse signal at the output terminal during working, the active output level corresponds to the level of a square wave pulse part of the square wave pulse signal, and the inactive output level corresponds to the level of a non-square wave pulse part.

In some examples, as shown in FIG. 10, the shift register unit further includes a first node reset circuit 150.

The first node reset circuit 150 is connected to the first node N1 and is configured to reset the first node N1 in response to a reset signal. For example, the first node reset circuit 150 is configured to be connected to the first node N1, the second voltage terminal VGL2 (e.g., providing a low level) or a separately provided voltage terminal (e.g., a low voltage terminal), and a reset terminal RST, so that the first node N1 is electrically connected to the second voltage terminal VGL2 or the low voltage terminal under the control of the reset signal input from the reset terminal RST, so as to perform pulling-down and resetting operations on the first node N1.

As shown in FIG. 10, in some examples, the shift register unit 500 further includes a second node control circuit 160, a first node noise reduction circuit 170, and an output noise reduction circuit 180.

The second node control circuit 160 is connected to the first node N1, the second node N2, and the third node N3, and is configured to control levels of the second node N2 and the third node N3 under the control of the level of the first node N1. For example, in one example, the second node control circuit 160 is connected to the first node N1, the second node N2, the third node N3, the second voltage terminal VGL2, the third voltage terminal VGH1, and the fourth voltage terminal VGH2 or a separately provided voltage terminal (for example, a high voltage terminal), thereby pulling down the levels of the second node N2 and the third node N3 to a low level. When the first node N1 is at a low level, the second node N2 and the third node N3 are connected to one of the third voltage terminal VGH1 or the fourth voltage terminal VGH2. When the first node N1 is at a high level, the second node N2 and the third node N3 are connected to the second voltage terminal VGL2 or a separately provided voltage terminal (for example, a low voltage terminal), thereby pulling down the second node N2 and the third node N3 to a low level.

For example, in another example, the level of the second node N2 is controlled by the level of the first node N1 and a third voltage provided by the third voltage terminal VGH1, and the level of the third node N3 is controlled by the level of the first node N1 and a fourth voltage provided by the fourth voltage terminal VGH2. Specific connection methods will be described in detail below.

For example, in one example, the third voltage terminal VGH1 and the fourth voltage terminal VGH2 may be set to alternately input a high level, that is, when the third voltage terminal VGH1 inputs a high level, the fourth voltage terminal VGH1 inputs a low level, and when the third voltage terminal VGH1 inputs a low level, the fourth voltage terminal VGH2 inputs a high level. In this way, the second node N2 and the third node N3 work alternately so that the transistors connected thereto can work alternately, thereby prolonging service life of these transistors. For example, in another example, the third voltage terminal VGH1 and the fourth voltage terminal VGH2 may be replaced by a clock signal terminal that alternately provides a high level (a DC (Direct Current) low level when the implemented transistors are P-type), which is not limited in the embodiments of the present disclosure.

The first node noise reduction circuit 170 is connected to the first node N1, the second node N2, and the third node N3, and is configured to perform noise reduction on the first node N1 under the control of levels of the second node N2 and the third node N3. For example, the first node noise reduction circuit 170 is connected to the first node N1, the second node N2, the third node N3, and the second voltage terminal VGL2, and is configured to be turned on when the second node N2 and the third node N3 are, for example, at a high level, so that the first node N1 is connected to the second voltage terminal VGL2 or a separately provided voltage terminal (for example, a low voltage terminal), and the potential of the first node N1 is pulled down to a non-working potential to achieve noise reduction on the first node N1.

The output noise reduction circuit 180 is connected to the second node N2, the third node N3, and the output terminal OUT, and is configured to perform noise reduction on the output terminal OUT under the control of the levels of the second node N2 and the third node N3. For example, the output noise reduction circuit 180 is connected to the second node N2, the third node N3, the second voltage terminal VGL2, and the output terminal OUT, and is configured to be turned on when the second node N2 is, for example, at a high level, so that the output terminal OUT is connected to the second voltage terminal VGL2 or a separately provided voltage terminal (for example, a low voltage terminal) to achieve noise reduction on the output terminal OUT.

As shown in FIG. 10, in other examples, the shift register unit 500 further includes a total reset circuit 190.

For example, the total reset circuit 190 is connected to the first node N1 and is configured to reset the first node N1 in response to a total reset signal. For example, the total reset circuit 190 is configured to be connected to the first node N1, the second voltage terminal VGL2 (for example, providing a low level) or a separately provided voltage terminal (for example, a low voltage terminal), and a total reset terminal TRST, so that the first node N1 is connected to the second voltage terminal VGL2 or a low voltage terminal under the control of the total reset signal input by the total reset terminal TRST to perform pulling-down and resetting operations on the first node N1.

For example, the first voltage terminal VGL1 is configured to provide a DC low-level signal (e.g., lower than or equal to the low-level portion of the clock signal), such as connected to ground. Here, the DC low-level signal is referred to as the first voltage. For example, the following embodiments are the same as this and will not be described again.

For example, the second voltage terminal VGL2 is configured to provide a DC low-level signal (for example, lower than or equal to the low-level portion of the clock signal), such as connected to ground. Here, the DC low-level signal is referred to as the second voltage. For example, the second voltage is lower than or equal to the first voltage, and the following embodiments are the same as this and will not be described again.

For example, the third voltage terminal VGH1 is configured to provide a DC high-level signal, and the signal provided by the third voltage terminal VGH1 is referred to as the third voltage. The fourth voltage terminal VGH2 is also configured to provide a DC high-level signal, and the signal provided by the fourth voltage terminal VGH2 is referred to as the fourth voltage. For example, the third voltage and the fourth voltage may be the same voltage, and both are greater than the first voltage and the second voltage. The following embodiments are the same as this and will not be described again.

FIG. 11 is a circuit diagram of a specific implementation example of the shift register unit shown in FIG. 10. As shown in FIG. 11, the shift register unit 500 includes a second to twenty-ninth transistors T2-T29, and further includes a storage capacitor C. It should be noted that in the following descriptions, each transistor is described as an N-type transistor, but this does not constitute a limitation on the embodiments of the present disclosure.

The input circuit 110 may be implemented as a fourth transistor T4. The gate electrode and the first electrode of the fourth transistor T4 are electrically connected to each other, and are configured to be connected to the input terminal INT to receive the input signal, and the second electrode of the fourth transistor T4 is configured to be connected to the first node N1, so that when the fourth transistor T4 is turned on due to a turn-on signal (e.g., a high-level signal) received by the input terminal INT, the turn-on signal is used to charge the first node N1 to make the first node N1 at a high level. For example, the gate electrode and the first electrode of the fourth transistor T4 are connected to the input terminal INT or other high voltage terminals (for example, the third voltage terminal VGH1 or the fourth voltage terminal VGH2), respectively, which are not limited in the embodiments of the present disclosure.

The output circuit 120 may be implemented to include a second transistor T2, a third transistor T3 and a storage capacitor C. The gate electrode of the second transistor T2 is connected to the first node N1, the first electrode of the second transistor T2 is connected to the clock signal terminal CLK to receive the second clock signal, and the second electrode of the second transistor T2 is connected to the shift output terminal CR. The gate electrode of the third transistor T3 is connected to the first node N1, the first electrode of the third transistor T3 is connected to the clock signal terminal CLK to receive the second clock signal, and the second electrode of the third transistor T3 is connected to the scanning signal output terminal OUT1 (i.e., the output terminal Gout shown in FIG. 3). The first electrode of the storage capacitor C is connected to the first node N1, and the second electrode of the storage capacitor C is connected to the scanning signal output terminal OUT1. It should be noted that, not limited to this, the shift register unit may further include more output signals and corresponding scanning signal output terminals.

For example, the clock signal terminal CLK is connected to one of the clock signal lines CLK1-CLKm shown in FIG. 3 to receive the second clock signal in the above-mentioned embodiments.

The first node control circuit 130 may be implemented to include a fourteenth transistor T14 and a twenty-fourth transistor T24. The gate electrode of the fourteenth transistor T14 is connected to the input terminal INT to receive the input signal, the first electrode of the fourteenth transistor T14 is connected to the second node N2, and the second electrode of the fourteenth transistor T14 is connected to the second voltage terminal VGL2. The gate electrode of the twenty-fourth transistor T24 is connected to the input terminal INT to receive the input signal, the first electrode of the twenty-fourth transistor T24 is connected to the third node N3, and the second electrode of the twenty-fourth transistor T24 is connected to the second voltage terminal VGL2.

The first node reset circuit 150 may be implemented as a fifth transistor T5. The gate electrode of the fifth transistor T5 is configured to be connected to the reset terminal RST to receive the reset signal, the first electrode of the fifth transistor T5 is connected to the first node N1, and the second electrode of the fifth transistor T5 is connected to the second voltage terminal VGL2 to receive the second voltage. When the fifth transistor T5 is turned on in response to the reset signal, the first node N1 is electrically connected to the second voltage terminal VGL2, so that the reset operation is performed on the first node N1. For example, in some examples, the reset terminal RST is connected to the output terminal of the shift register that is cascaded with the reset terminal RST to realize real-time reset of the first node N1 of the shift register unit of the stage during the shift outputting process of the gate scanning signals, so as to avoid erroneous output of the output terminal.

The total reset circuit 190 may be implemented as a sixth transistor T6. The gate electrode of the sixth transistor T6 is connected to the total reset terminal TRST to receive the total reset signal, the first electrode of the sixth transistor T6 is connected to the first node N1, and the second electrode of the sixth transistor T6 is connected to the second voltage terminal VGL2 to receive the second voltage. When the sixth transistor T6 is turned on in response to the total reset signal, the first node N1 is electrically connected to the second voltage terminal VGL2, so that the reset operation is performed on first node N1. For example, the total reset circuit 190 is configured to globally reset all the shift register units that are cascaded during a start stage of the display stage of one frame of image or during an end stage of the display stage of one frame of image. For example, the timing of the total reset signal is earlier than a trigger signal (which will be described in detail later) which controls the start stage of the display stage of one frame of image, so that first nodes N1 of all shift register units can be reset during the start stage of the display stage of one frame of image to avoid abnormality of the display pattern.

For example, in one example, the second node control circuit 160 may be implemented to include a seventh transistor T7, an eighth transistor T8, a ninth transistor T9, and a tenth transistor T10. The gate electrode of the seventh transistor T7 is connected to a first control node CN1, the first electrode of the seventh transistor T7 is connected to the third voltage terminal VGH1 to receive the third voltage, and the second electrode of the seventh transistor T7 is connected to the second node N2; the gate electrode of the eighth transistor T8 is connected to the first node N1, the first electrode of the eighth transistor T8 is connected to the second node N2, and the second electrode of the eighth transistor T8 is connected to the second voltage terminal VGL2 to receive the second voltage. The gate electrode and the first electrode of the ninth transistor T9 are electrically connected to each other, and are configured to be both connected to the third voltage terminal VGH1 to receive the third voltage, and the second electrode of the ninth transistor T9 is connected to the first control node CN1; the gate electrode of the tenth transistor T10 is connected to the first node N1, the first electrode of the tenth transistor T10 is connected to the first control node CN1, and the second electrode of the tenth transistor T10 is connected to the second voltage terminal VGL2 to receive the second voltage.

For example, in another example, the second node control circuit 160 further includes a twenty-seventh transistor T27, a twenty-eighth transistor T28, a twenty-ninth transistor T29, and a twentieth transistor T20. The gate electrode of the twenty-seventh transistor T27 is connected to the second control node CN2, the first electrode of the twenty-seventh transistor T27 is connected to the fourth voltage terminal VGH2 to receive the fourth voltage, and the second electrode of the twenty-seventh transistor T27 is connected to the third node N3; the gate electrode of the twenty-eighth transistor T28 is connected to the first node N1, the first electrode of the twenty-eighth transistor T28 is connected to the third node N3, and the second electrode of the twenty-eighth transistor T28 is connected to the second voltage terminal VGL2 to receive the second voltage. The gate electrode and the first electrode of the twenty-ninth transistor T29 are electrically connected to each other, and are configured to be both connected to the fourth voltage terminal VGH2 to receive the fourth voltage, and the second electrode of the twenty-ninth transistor T29 is connected to the second control node CN2; the gate electrode of the twentieth transistor T20 is connected to the first node N1, the first electrode of the twentieth transistor T20 is connected to the second control node CN2, and the second electrode of the twentieth transistor T20 is connected to the second voltage terminal VGL2 to receive the second voltage.

The first node noise reduction circuit 170 may be implemented to include an eleventh transistor T11 and a twenty-first transistor T21. The gate electrode of the eleventh transistor T11 is connected to the second node N2, the first electrode of the eleventh transistor T11 is connected to the first node N1, and the second electrode of the eleventh transistor T11 is connected to the second voltage terminal VGL2 to receive the second voltage. The eleventh transistor T11 is turned on when the second node N2 is at a high potential, so as to connect the first node N1 and the second voltage terminal VGL2, so that the first node N1 can be pulled down to achieve noise reduction. The gate electrode of the twenty-first transistor T21 is connected to the third node N3, the first electrode of the twenty-first transistor is connected to the first node N1, and the second electrode of the twenty-first transistor is connected to the second voltage terminal VGL2 to receive the second voltage. The twenty-first transistor T21 is turned on when the third node N3 is at a high potential, so as to connect the first node N1 and the second voltage terminal VGL2, so that the first node N1 can be pulled down to achieve noise reduction. For example, the eleventh transistor T11 and the twenty-first transistor T21 alternately work under the control of levels of the second node N2 and the third node N3, respectively, to prolong service life of these transistors.

For example, in one example, the output terminal OUT includes a shift output terminal CR and a scanning signal output terminal OUT1 (i.e., the output terminal Gout of the gate driving circuit), and the output noise reduction circuit 180 may be implemented to include a twelfth transistor T12, a twenty-second transistor T22, a thirteenth transistor T13, and a twenty-third transistor T23. The twelfth transistor T12 and the twenty-second transistor T22 are configured for noise reduction of the shift output terminal CR, and the thirteenth transistor T13 and the twenty-third transistor T23 are configured for noise reduction of the scanning signal output terminal OUT1. In the case where more scanning signal output terminals are included, the output noise reduction circuit 180 may further include more transistors to achieve noise reduction on the scanning signal output terminals.

The gate electrode of the twelfth transistor T12 is connected to the second node N2, the first electrode of the twelfth transistor T12 is connected to the shift output terminal CR, and the second electrode of the twelfth transistor T12 is connected to the second voltage terminal VGL2 to receive the second voltage. The twelfth transistor T12 is turned on when the second node N2 is at a high potential, so as to connect the shift output terminal CR and the second voltage terminal VGL2, thereby reducing noise on the shift output terminal CR. The gate electrode of the twenty-second transistor T22 is connected to the third node N3, the first electrode of the twenty-second transistor T22 is connected to the shift output terminal CR, and the second electrode of the twenty-second transistor T22 is connected to the second voltage terminal VGL2 to receive the second voltage. The twenty-second transistor T22 is turned on when the third node N3 is at a high potential, so as to connect the shift output terminal CR and the second voltage terminal VGL2, thereby reducing noise on the shift output terminal CR. For example, the twelfth transistor T12 and the twenty-second transistor T22 alternately work under the control of the levels of the second node N2 and the third node N3, respectively, to prolong service life of these transistors.

The gate electrode of the thirteenth transistor T13 is connected to the second node N2, the first electrode of the thirteenth transistor T13 is connected to the scanning signal output terminal OUT1, and the second electrode of the thirteenth transistor T13 is connected to the first voltage terminal VGL1 to receive the first voltage. The thirteenth transistor T13 is turned on when the second node N2 is at a high potential, so as to connect the scanning signal output terminal OUT1 and the first voltage terminal VGL1, thereby reducing noise on the scanning signal output terminal OUT1. The gate electrode of the twenty-third transistor T23 is connected to the third node N3, the first electrode of the twenty-third transistor T23 is connected to the scanning signal output terminal OUT1, and the second electrode of the twenty-third transistor T23 is connected to the first voltage terminal VGL1 to receive the first voltage. The twenty-third transistor T23 is turned on when the third node N3 is at a high potential, so as to connect the scanning signal output terminal OUT1 and the first voltage terminal VGL1, thereby reducing noise on the scanning signal output terminal OUT1. For example, the thirteenth transistor T13 and the twenty-third transistor T23 alternately work under the control of the levels of the second node N2 and the third node N3, respectively, to prolong service life of these transistors.

In the embodiments of the present disclosure, for example, in the case where each circuit is implemented by N-type transistors, the term "pull-up" means charging a node or an electrode of a transistor to allow the absolute value of the level of the node or the electrode to be increased, thereby realizing an operation (e.g., turning on) of the corresponding transistor; and the term "pull-down" means discharging a node or an electrode of a transistor to reduce the absolute value of the level of the node or the electrode, thereby realizing an operation (e.g., turning off) of the corresponding transistor.

For example, in the case where each circuit is implemented by P-type transistors, the term "pull-up" means discharging a node or an electrode of a transistor o allow the absolute value of the level of the node or the electrode to be reduced, thereby realizing an operation (e.g., turning on) of the corresponding transistor; and the term "pull down" means charging a node or an electrode of a transistor to allow the absolute value of the level of the node or the electrode to be increased, thereby realizing an operation (e.g., turning off) of the corresponding transistor.

It should be noted that, in the description of each embodiment of the present disclosure, the first node N1, the second node N2, the third node N3, the first control node CN1 and the second control node CN2 do not represent actual components, but represent junction points of relevant electrical connections in the circuit diagram.

It should be noted that each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode.

In addition, the transistors in the embodiments of the present disclosure are all described by taking N-type transistors as an example. In this case, the first electrode of the transistor is the drain electrode, and the second electrode is the source electrode. It should be noted that the present disclosure includes but is not limited to this. For example, one or more transistors in the shift register unit 500 provided by the embodiments of the present disclosure may also adopt P-type transistors. In this case, the first electrode of the transistor is the source electrode, and the second electrode is the drain electrode. For the electrodes, it is only necessary to connect the electrodes of the selected type of transistors with reference to the electrodes of the corresponding transistors in the embodiments of the present disclosure, and cause the corresponding voltage terminals to provide corresponding high voltage or low voltage. In the case where the N-type transistors are adopted, indium gallium zinc oxide (IGZO) may be adopted as an active layer of the thin film transistor, and compared with the adopting of low temperature polysilicon (LTPS) or amorphous silicon (for example, hydrogenated amorphous silicon) as the active layer of the thin film transistor, the size of the transistor can be effectively reduced and leakage current can be prevented.

FIG. 12 is a driving timing diagram of a shift register unit provided by at least one embodiment of the present disclosure. The level of a potential in the signal timing diagram as shown in FIG. 12 is only schematic and does not represent the true potential value or relative ratio. Corresponding to the above-mentioned example, the high-level signal corresponds to a turn-on signal of the N-type transistor, and the low-level signal corresponds to a turn-off signal of the N-type transistor.

For example, in one example, combining with the signal timing diagram as shown in FIG. 12, the working principle of the (N)th-stage shift register unit 500 of the gate driving circuit 10 as shown in FIG. 11 will be described below. The working principle of the shift register unit 500 is as follows.

In the first stage 1, the input terminal INT provides a high level, and the clock signal terminal CLK provides a low level of the second clock signal. Therefore, the fourth transistor T4 is turned on, and the first node N1 is charged to a first high level. Meanwhile, the fourteenth transistor T14 and the twenty-fourth transistor T24 are turned on, so that the second node N2 and the third node N3 are pulled down to a low level. In the first stage 1, the second transistor T2 and the third transistor T3 are turned on in response to the first high level of the first node N1, thereby outputting the low level of the second clock signal provided by the clock signal terminal CLK to the shift output terminal CR and the scanning signal output terminal OUT1.

In the second stage 2, the input terminal INT inputs a low level, the clock signal terminal CLK provides a high level of the second clock signal, the second electrode of the storage capacitor C is changed from a low level to a high level, and the voltage of the first electrode (i.e., the first node N1) of the storage capacitor C is bootstrapped according to the characteristic that the voltage at both ends of the capacitor cannot change suddenly. Therefore, in the second stage 2, the first node N1 is charged to a second high level, so that the second transistor T2 and the third transistor T3 are turned on in response to the second high level of the first node N1. Meanwhile, in the second stage 2, the shift output terminal CR and the scanning signal output terminal OUT1 of the shift register unit output a high level.

For example, in the second stage 2, in the case where the second clock signal adopts the waveform as shown in FIG. 9, the voltage of the first electrode (i.e., the first node N1) of the storage capacitor C is bootstrapped according to the characteristic that the voltage at both ends of the capacitor cannot change suddenly. Therefore, in the second stage 2, the first node N1 is charged to a third sub-level VGH5, so that the level of the first node N1 is bootstrapped higher, so that the second transistor T2 and the third transistor T3 can be turned on more thoroughly, thereby facilitating the output of the second clock signal.

In the third stage 3, the clock signal terminal CLK provides the low level of the second clock signal, the second electrode of the storage capacitor C changes from the high level to the low level, and the voltage of the first electrode of the storage capacitor C (i.e., the first node N1) is changed to the first high level according to the characteristic that the voltage at both ends of the capacitor cannot change suddenly. Therefore, in the third stage 3, the second transistor T2 and the third transistor T3 are turned on in response to the first high level of the first node N1, and the shift output terminal CR and the scanning signal output terminal OUT1 of the shift register unit output the low level of the second clock signal.

In the fourth stage 4, the reset terminal RST provides a high level of the reset signal. Therefore, the fifth transistor T5 is turned on, so that the first node N1 is connected to the second voltage terminal VGL2, so that the level of the first node N1 is changed to a low level, and the levels of the second node N2 and the third node N3 are changed to a high level. Therefore, in the fourth stage, the second transistor T2 and the third transistor T3 are turned off in response to the low level of the first node N1, and the twelfth transistor T12, the twenty-second transistor T22, the thirteenth transistor T13, and the twenty-third transistor T23 are turned on, so that the shift output terminal CR and the scanning signal output terminal OUT1 of the shift register unit output a low level.

Before the start of the first stage 1, the total reset terminal TRST provides a high level of the total reset signal, so that the sixth transistor T6 is turned on, and thus the first nodes N1 of all the shift register units of the gate driving circuit can be reset.

Figure 13:
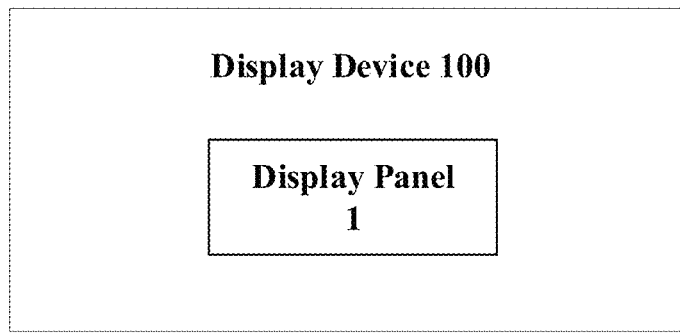
FIG. 13 is a schematic diagram of a display device provided by at least one embodiment of the present disclosure.

At least one embodiment of the present disclosure further provides a display device. FIG. 13 is a schematic diagram of a display device provided by at least one embodiment of the present disclosure. For example, as shown in FIG. 13, the display device 100 includes the display panel 1 provided by any embodiment of the present disclosure.

It should be noted that the display device 100 in the embodiment may be any product or component with a display function, such as a liquid crystal panel, a liquid crystal TV, a display, an OLED panel, an OLED TV, an electronic paper display device, a mobile phone, a tablet computer, a notebook computer, a digital photo frame, a navigator, etc. The display device 100 may further include other conventional components such as a display panel, which is not limited in the embodiments of the present disclosure.

The technical effects of the display device 100 according to the embodiments of the present disclosure may refer to the corresponding descriptions on the display panel in the above-mentioned embodiments, and details are not repeated here.

It should be noted that, for clarity and conciseness, the entire structure of the display device 100 is not given. In order to realize the necessary functions of the display device, those skilled in the art may set other structures not shown according to specific application scenarios, which are not limited in the embodiments of the present disclosure.

The following statements should be noted:
(1) The drawings involve only the structure(s) in connection with the embodiment(s) of the present disclosure, and other structure(s) can be referred to common design(s).
(2) In case of no conflict, features in one embodiment or in different embodiments can be combined to obtain new embodiments.

What have been described above are only exemplary implementations of the present disclosure, and are not intended to limit the protection scope of the present disclosure. The protection scope of the present disclosure is based on the protection scope of the claims.

What is claimed is:

1. A display panel, comprising a gate driving circuit, a plurality of clock signal lines, a timing controller and a plurality of anti-cross-row circuits, wherein
the timing controller is configured to provide a first clock signal;
the plurality of anti-cross-row circuits are connected with the timing controller and the plurality of clock signal lines, and are configured to adjust the first clock signal provided by the timing controller to a second clock signal, and output the second clock signal to the plurality of clock signal lines, wherein a falling duration of a falling edge of the second clock signal is less than a falling duration of a falling edge of the first clock signal;

the gate driving circuit comprises a plurality of shift register units that are cascaded and is connected with the plurality of clock signal lines, respectively, and the gate driving circuit is configured to output the second clock signal as an output signal line by line; and each of the plurality of anti-cross-row circuits comprises at least one resistor and at least one inductor.

2. The display panel according to claim 1, wherein the at least one resistor and the at least one inductor are connected in series or in parallel.

3. The display panel according to claim 1, wherein a first end of the at least one resistor is connected with the timing controller, and a second end of the at least one resistor is connected with the at least one inductor.

4. The display panel according to claim 1, wherein a total resistance value of an equivalent resistance of each of the plurality of anti-cross-row circuits is in a range from 1 ohm to 1000 ohm; and a total inductance value of an equivalent inductance of each of the plurality of anti-cross-row circuits is in a range from 1 microhenry to 1000 microhenry.

5. The display panel according to claim 1, wherein the at least one resistor comprises a first resistor and a second resistor, and the at least one inductor comprises a first inductor and a second inductor;

the first resistor and the first inductor are connected in parallel to form a first element, and the second resistor and the second inductor are connected in parallel to form a second element; and the first element and the second element are connected in series.

6. The display panel according to claim 5, wherein a total resistance value of an equivalent resistance of the first element and an equivalent resistance of the second element is in a range from 1 ohm to 1000 ohm; or a total inductance value of an equivalent inductance of the first element and an equivalent inductance of the second element is in a range from 1 microhenry to 1000 microhenry.

7. The display panel according to claim 1, wherein the first clock signal comprises a first level and a second level sequentially arranged in a time domain, and the second clock signal comprises a third level and a fourth level sequentially arranged in the time domain;

the first level is higher than the second level, and the third level is higher than the fourth level;

the fourth level comprises a first sub-level and a second sub-level; and in the time domain, the second sub-level is between the third level and the first sub-level, wherein the second sub-level is lower than the first sub-level.

8. The display panel according to claim 7, wherein the first level is equal to the third level, and the first sub-level is equal to the second level.

9. The display panel according to claim 7, wherein the third level comprises a third sub-level and a fourth sub-level;

in the time domain, the fourth sub-level is between the third sub-level and the second sub-level; and the third sub-level is higher than the fourth sub-level.

10. The display panel according to claim 9, wherein the fourth sub-level is equal to the first level.

11. The display panel according to claim 7, further comprising a level conversion circuit, configured to convert the first clock signal into the second clock signal.

12. The display panel according to claim 1, wherein the first clock signal comprises a first level and a second level sequentially arranged in a time domain, the second clock signal comprises a third level and a fourth level sequentially arranged in the time domain, the first level is higher than the second level, and the third level is higher than the fourth level; and the second level is higher than the fourth level.

13. The display panel according to claim 12, wherein the third level is higher than the first level.

14. The display panel according to claim 1, wherein each of the plurality of shift register units comprises an input circuit, an output circuit and a first node control circuit;

the input circuit is connected with a first node, and is configured to charge the first node in response to an input signal;

the output circuit is connected with the first node, and is configured to output an output signal to an output terminal under control of a level of the first node; and the first node control circuit is connected with a second node and a third node, respectively, and is configured to control a level of the second node and a level of the third node in response to the input signal.

15. The display panel according to claim 14, wherein each of the plurality of shift register units further comprises a total reset circuit; and the total reset circuit is connected with the first node and a total reset terminal, and is configured to receive a total reset signal from the total reset terminal and control the level of the first node in response to the total reset signal.

16. The display panel according to claim 14, wherein each of the plurality of shift register units further comprises a first node reset circuit, and the first node reset circuit is connected with the first node and configured to reset the first node in response to a reset signal.

17. The display panel according to claim 14, wherein each of the plurality of shift register units further comprises a second node control circuit, a first node noise reduction circuit and an output noise reduction circuit;

the second node control circuit is connected with the first node, the second node and the third node, respectively, and is configured to control the level of the second node and the level of the third node under control of the level of the first node;

the first node noise reduction circuit is connected with the first node, the second node and the third node, and is configured to reduce noise of the first node under control of the level of the second node and the level of the third node; and the output noise reduction circuit is connected with the second node, the third node and the output terminal, and is configured to reduce noise of the output terminal under the control of the level of the second node and the level of the third node.

18. The display panel according claim 14, wherein the output terminal comprises a shift output terminal and at least one scanning signal output terminal;

the at least one scanning signal output terminal comprises one scanning signal output terminal, and the output circuit comprises a second transistor, a third transistor and a storage capacitor;

a gate electrode of the second transistor is connected with the first node, a first electrode of the second transistor is connected with a clock signal terminal to receive the second clock signal, and a second electrode of the second transistor is connected with the shift output terminal;

a gate electrode of the third transistor is connected with the first node, a first electrode of the third transistor is connected with the clock signal terminal to receive the second clock signal, and a second electrode of the third transistor is connected with the scanning signal output terminal;

a first electrode of the storage capacitor is connected with the first node, and a second electrode of the storage capacitor is connected with the scanning signal output terminal; and the second clock signal is transmitted to the output terminal as the output signal.

19. The display panel according to claim 1, further comprising a display region, a peripheral region surrounding the display region, and a circuit board, wherein the display region comprises a plurality of pixels arranged in array and is configured to receive output signals from the gate driving circuit for displaying;

the gate driving circuit and the plurality of clock signal lines are in the peripheral region, the peripheral region comprises a corner part, and the corner part comprises some shift register units of the gate driving circuit and the plurality of clock signal lines; and the timing controller and the plurality of anti-cross-row circuits are on the circuit board.

20. A display device, comprising a display panel, wherein the display panel comprises a gate driving circuit, a plurality of clock signal lines, a timing controller and a plurality of anti-cross-row circuits;

the timing controller is configured to provide a first clock signal;

the plurality of anti-cross-row circuits are connected with the timing controller and the plurality of clock signal lines, and are configured to adjust the first clock signal provided by the timing controller to a second clock signal, and output the second clock signal to the plurality of clock signal lines, wherein a falling duration of a falling edge of the second clock signal is less than a falling duration of a falling edge of the first clock signal;

the gate driving circuit comprises a plurality of shift register units that are cascaded and is connected with the plurality of clock signal lines, respectively, and the gate driving circuit is configured to output the second clock signal as an output signal line by line; and each of the plurality of anti-cross-row circuits comprises at least one resistor and at least one inductor.

* * * * *